United States Patent
Dabral et al.

(10) Patent No.: US 11,862,557 B2
(45) Date of Patent: Jan. 2, 2024

(54) SELECTABLE MONOLITHIC OR EXTERNAL SCALABLE DIE-TO-DIE INTERCONNECTION SYSTEM METHODOLOGY

(71) Applicant: Apple Inc., Cupertino, CA (US)

(72) Inventors: Sanjay Dabral, Cupertino, CA (US);
Jun Zhai, Cupertino, CA (US);
Jung-Cheng Yeh, Sunnyvale, CA (US);
Kunzhong Hu, Cupertino, CA (US);
Raymundo Camenforte, San Jose, CA (US); Thomas Hoffmann, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 90 days.

(21) Appl. No.: 17/483,535

(22) Filed: Sep. 23, 2021

(65) Prior Publication Data

US 2023/0085890 A1    Mar. 23, 2023

(51) Int. Cl.
*H01L 21/00*     (2006.01)
*H01L 23/528*    (2006.01)
(Continued)

(52) U.S. Cl.
CPC ......... *H01L 23/528* (2013.01); *H01L 23/481* (2013.01); *H01L 23/5386* (2013.01); *H01L 23/585* (2013.01); *H01L 25/0652* (2013.01); *H01L 25/0655* (2013.01); *H01L 21/78* (2013.01); *H01L 22/20* (2013.01); *H01L 24/05* (2013.01); *H01L 24/06* (2013.01); *H01L 24/08* (2013.01); *H01L 24/30* (2013.01); *H01L 24/32* (2013.01); *H01L 2224/0557* (2013.01); *H01L 2224/06181* (2013.01); *H01L 2224/08145* (2013.01); *H01L 2224/08225* (2013.01); (Continued)

(58) Field of Classification Search
CPC . H01L 23/528; H01L 23/481; H01L 23/5386; H01L 23/585
See application file for complete search history.

(56) References Cited

U.S. PATENT DOCUMENTS 6,003,107 A * 12/1999 Ranson ............... G06F 7/02
710/316
10,141,291 B2 * 11/2018 Shao ............... H01L 21/76802
(Continued)

FOREIGN PATENT DOCUMENTS

TW    201314862 A    4/2013
TW    201715621 A    5/2017
(Continued)

OTHER PUBLICATIONS

PCT/US2022/075471, "PCT Notification of Transmittal of the International Search Report and the Written Opinion of the International Searching Authority, or the Declaration" dated Dec. 16, 2022, 15 Pages.

*Primary Examiner* — Laura M Menz
(74) *Attorney, Agent, or Firm* — Aikin & Gallant, LLP

(57) ABSTRACT

Multi-die structures and methods of fabrication are described. In an embodiment, a multi-die structure includes a first die, a second die, and die-to-die routing connecting the first die to the second die. The die-to-die interconnection may be monolithically integrated as a chip-level die-to-die routing, or external package-level die-to-die routing.

11 Claims, 14 Drawing Sheets

(51) Int. Cl.
*H01L 23/538* (2006.01)
*H01L 23/48* (2006.01)
*H01L 25/065* (2023.01)
*H01L 23/58* (2006.01)
*H01L 21/66* (2006.01)
*H01L 23/00* (2006.01)
*H01L 21/78* (2006.01)

(52) U.S. Cl.
CPC ............ *H01L 2224/30181* (2013.01); *H01L 2224/32145* (2013.01); *H01L 2224/32225* (2013.01)

(56) References Cited

U.S. PATENT DOCUMENTS

| | | | | |
|---|---|---|---|---|
| 10,438,896 B2 * | 10/2019 | Dabral | .................. | H01L 23/488 |
| 10,515,939 B2 * | 12/2019 | Chen | .................. | H01L 25/0655 |
| 10,644,826 B2 * | 5/2020 | Wuu | .................. | H01L 24/73 |
| 10,985,107 B2 * | 4/2021 | Dabral | ................ | H01L 23/5283 |
| 11,476,203 B2 * | 10/2022 | Dabral | ................ | H01L 23/585 |
| 11,538,762 B2 * | 12/2022 | Chun | .................. | H01L 24/80 |
| 2013/0307143 A1 * | 11/2013 | Lin | .................. | H01L 24/82 257/737 |
| 2016/0240497 A1 * | 8/2016 | Chen | .................. | H01L 25/0655 |
| 2017/0117263 A1 * | 4/2017 | Yeh | .................. | H01L 25/0657 |
| 2017/0154881 A1 * | 6/2017 | Shao | .................. | H01L 21/78 |
| 2018/0294230 A1 * | 10/2018 | Dabral | .................. | H01L 23/58 |
| 2019/0268086 A1 * | 8/2019 | Wuu | .................. | H01L 24/08 |
| 2019/0319626 A1 * | 10/2019 | Dabral | ................ | G06F 15/7807 |
| 2020/0075497 A1 * | 3/2020 | Dabral | ................ | H01L 23/5283 |
| 2020/0076424 A1 * | 3/2020 | Dubey | .............. | H03K 17/6871 |
| 2020/0176419 A1 * | 6/2020 | Dabral | .................. | H01L 25/50 |
| 2020/0294915 A1 * | 9/2020 | Chu | .................. | H01L 24/14 |
| 2021/0082830 A1 * | 3/2021 | Lee | .................. | H01L 23/3128 |
| 2021/0217702 A1 * | 7/2021 | Dabral | .................. | H01L 24/19 |
| 2021/0272929 A1 * | 9/2021 | Tsai | .................. | H01L 24/82 |
| 2022/0013504 A1 * | 1/2022 | Dabral | .................. | H01L 24/96 |
| 2022/0199517 A1 * | 6/2022 | Dabral | .................. | H01L 24/08 |
| 2022/0293433 A1 * | 9/2022 | Dabral | .................. | H01L 23/522 |
| 2022/0375864 A1 * | 11/2022 | Wang | .................. | H01L 24/73 |
| 2023/0040308 A1 * | 2/2023 | Ramachandran | ....... | H01L 21/78 |
| 2023/0052432 A1 * | 2/2023 | Dabral | .................. | H01L 23/58 |
| 2023/0085890 A1 * | 3/2023 | Dabral | .................. | H01L 25/50 257/621 |

FOREIGN PATENT DOCUMENTS

| | | | | |
|---|---|---|---|---|
| TW | 201729362 A | | 8/2017 | |
| TW | 202114108 A | | 4/2021 | |
| TW | 202301624 A | * | 1/2023 | ............. H01L 21/56 |
| WO | WO-2022191974 A1 | * | 9/2022 | ............. H01L 21/56 |
| WO | WO-2023019070 A1 | * | 2/2023 | ............. H01L 21/78 |
| WO | WO-2023049597 A1 | * | 3/2023 | ........... H01L 23/481 |

\* cited by examiner

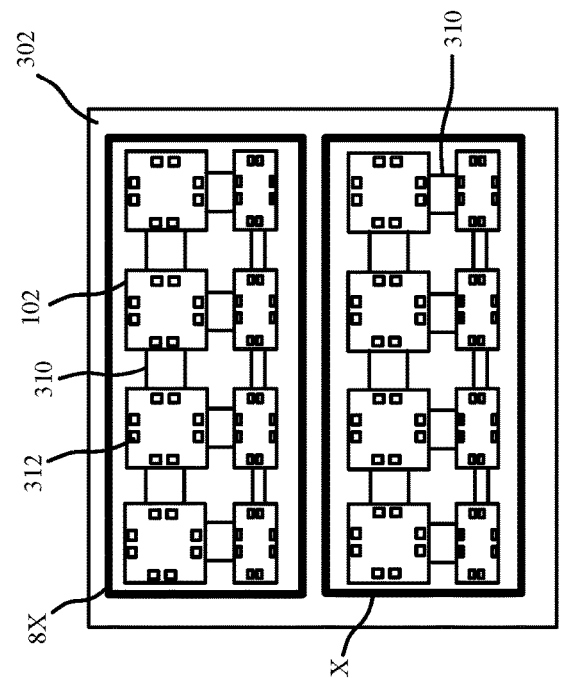
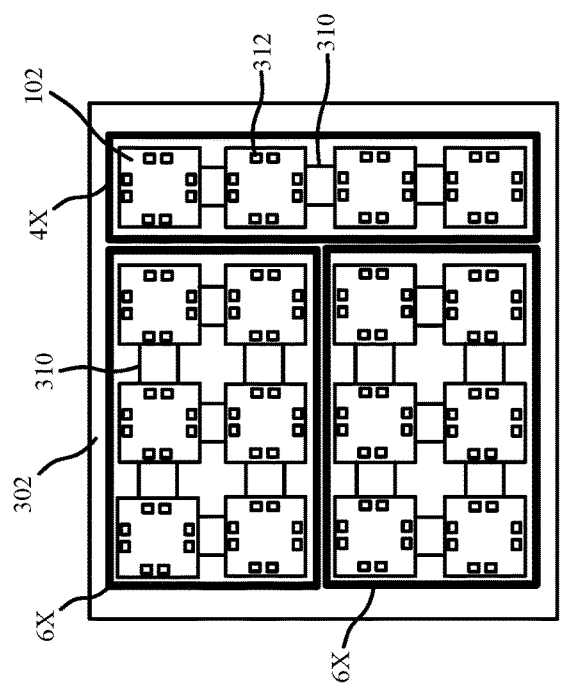
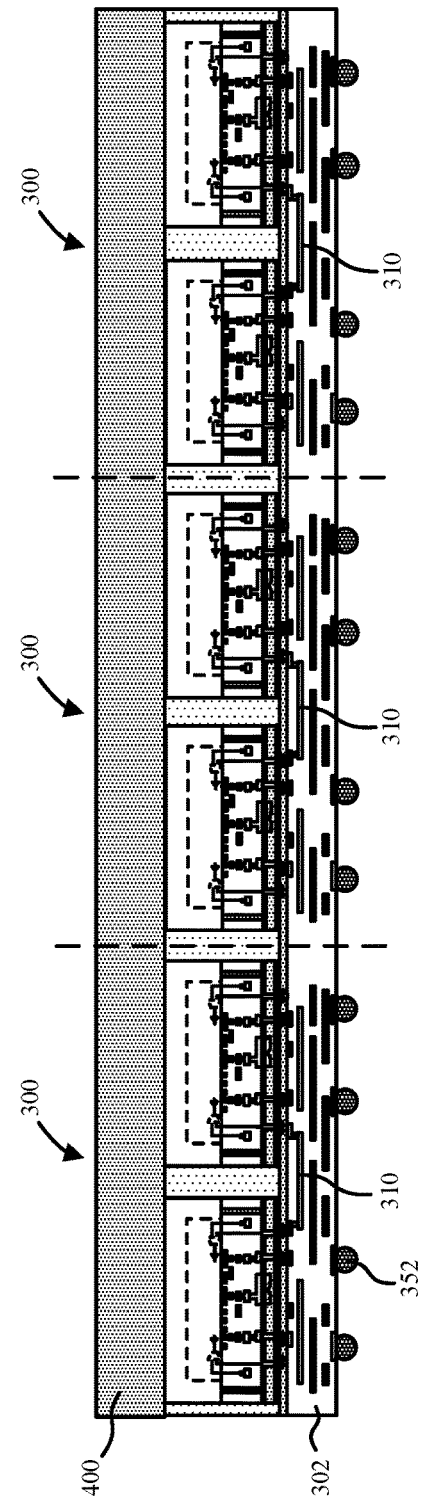
FIG. 10A
FIG. 10B
FIG. 10C

SELECTABLE MONOLITHIC OR EXTERNAL SCALABLE DIE-TO-DIE INTERCONNECTION SYSTEM METHODOLOGY

BACKGROUND

Field

Embodiments described herein relate to integrated circuit (IC) manufacture, and the interconnection of multiple dies.

Background Information

Microelectronic fabrication of ICs is typically performed using a sequence of deposition and patterning of circuit elements in a layer-by-layer sequence in which a stepper (or scanner) is used to pass light through a reticle, forming an image of the reticle pattern on an underlying layer. Rather than expose an entire wafer, the stepper moves in steps across the wafer from one die area location to another. In this manner, working on a limited area enables higher resolution and critical dimensions. Dies can then be scribed from the wafer and further packaged.

A multi-chip module (MCM) is generally an electronic assembly in which multiple dies are integrated on a substrate. Various implementations of MCMs include two-dimensional (2D), 2.5D and three-dimensional (3D) packaging. Generally, 2D packaging modules include multiple dies arranged side-by-side on a package substrate. In 2.5D packaging technologies multiple dies and bonded to an interposer with microbumps. The interposer in turn is then bonded to a package substrate. The interposer may include routing to interconnect the adjacent die. Thus, the dies in 2.5D packaging can be directly connected to the interposer and are connected to each other through routing within the interposer. Generally, 3D packaging modules include multiple dies stacked vertically on top of each other. Thus, the die in 3D packaging can be directly connected to each other, with the bottom die directly connected to a package substrate. The top die in a 3D package can be connected to the package substrate using a variety of configurations, including wire bonds, and through-silicon vias (TSVs) though the bottom die.

More recently it has been proposed in U.S. Pat. No. 10,438,896 to connect adjacent dies formed in the same substrate with stitch routing. Thus, the back-end-of-the-line (BEOL) build-up structure commonly reserved for individual die interconnection can be leveraged to for die-to-die routing to connect adjacent die areas in the same substrate. In this manner, die sets can be scribed from the same wafer. Furthermore, these die sets can be larger than a single reticle size. These die sets can then be further integrated in various modules or semiconductor packages.

Even more recently it has been proposed in U.S. Publication No. 2020/0176419 to connect die sets in a reconstituted wafer approach in which known good dies including partially fabricated die-level back-end-of-the-line (BEOL) build-up structures are integrated into a reconstituted wafer, followed by the formation of a chip-level BEOL build-up structure over the dies, where the chip-level BEOL build-up structure includes specified die-to-die routing for dicing of specified die sets.

SUMMARY

Multi-die structures and methods of integrating multi-die structures into chips and packages are described in which the dies are designed with redundant die-to-die routing layouts. In an embodiment, a plurality of die areas is patterned into a semiconductor wafer, followed by the formation of a chip-level BEOL build-up structure across the semiconductor substrate which can include chip-level die-to-die routing, inter-die routing for potential subsequent package-level die-to-die connection, and/or bypass routing and through silicon vias for potential subsequent 3D package-level die-to-die connection. In accordance with embodiments, die sets with monolithic chip-level die-to-die routing can be diced or singulated, or dies (or die sets) can be diced for subsequent external die-to-die interconnection with package-level die-to-die routing or through silicon vias.

In an exemplary monolithic die-to-die interconnection embodiment, a multi-die structure includes a first front-end-of-the line (FEOL) die area of a first die patterned into a semiconductor substrate and a second FEOL die area of a second die patterned into the semiconductor substrate, with the second FEOL die area separate from the first FEOL die area. A first selection device may be formed within the first FEOL die area, and a second selection device formed within the second FEOL die area. In an embodiment, a BEOL build-up structure spans over the first FEOL die area and the second FEOL die area, and the BEOL build-up structure includes a chip-level die-to-die routing connecting the first selection device with the second selection device, a first inter-chip routing connected to the first selection device, and a second inter-chip routing with the second selection device. For example, the first FEOL die area can include a transceiver connected to an input of the first selection device, and the second FEOL die area can include a receiver connected to an output of the second selection device. Through silicon vias (TSV) can optionally be connected to the first selection device and/or the second selection device.

The first inter-chip routing may be electrically connected to an electrically open first terminal, and the second inter-chip routing electrically connected to an electrically open second terminal. The first terminal and the second terminal may both be buried within the BEOL build-up structure beneath a face side of the BEOL build-up structure. The BEOL build-up structure may also include additional routing connecting the first FEOL die and the second FEOL die area to a plurality of chip-level landing pads. In some configurations, a corresponding plurality of solder bumps is located on the plurality of chip-level landing pads.

The monolithic chip-level die-to-die routing can assume a variety of configurations between die sets and along dice die edges. The BEOL build-up structure can include a first metallic seal adjacent the first FEOL die area, and a second metallic seal adjacent the second FEOL die area, where the chip-level die-to-die routing extends through a first opening in the first metallic seal and a second opening in the second metallic seal. Similarly, the BEOL build-up structure can include a first metallic seal adjacent the first FEOL die area, and a second metallic seal adjacent the second FEOL die area, where the chip-level die-to-die routing extends over the first metallic seal and the second metallic seal. In an embodiment, the first FEOL die area includes a third selection device, the first BEOL build-up structure includes an open chip-level die-to-die routing connected to the third selection device, and the open chip-level die-to-die routing extends through a second opening in the first metallic seal. For example, the open chip-level die-to-die routing may terminate at a side edge of the first die.

In an exemplary external die-to-die interconnection embodiment, a multi-die structure includes a routing layer that includes a first package-level bond pad, a second package-level bond pad, and a package-level die-to-die routing electrically connecting the first package-level bond pad to the second package-level bond pad. A first die is bonded to a first side of the routing layer and in electrical connection with the first package-level bond pad, and a second die is bonded to the first side of the routing layer and in electrical connection with the second package-level bond pad. In an embodiment, the first die includes a first FEOL die area including a communication device, such as a transceiver or receiver, and a first BEOL build-up structure spanning over the first FEOL die area, with the first BEOL build-up structure including an intra-chip routing connected to the communication device, and a chip-level die-to-die routing connecting the communication device to a first bond pad of the first BEOL build-up structure, and where the first bond pad is bonded to the routing layer and electrically connected to the first package-level bond pad. The first FEOL die area can include a selection device such as a multiplexer or demultiplexer connected between the communication device and the chip-level die-to-die routing and the intra-chip routing. A TSV can optionally be connected to the selection device.

In some configurations the intra-chip routing can be electrically open. In an exemplary structure, the BEOL build-up structure includes a first metallic seal adjacent the first FEOL die area, and the intra-chip routing does is confined laterally inside the metallic seal. The first bond pad may be in direct contact with the first package-level bond pad. For example, this may be the result of hybrid bonding the first die to the routing layer with dielectric-dielectric and metal-metal bonds in a chip-on-wafer configuration. The routing layer may be an interposer, and may be active or passive. For example, and the routing layer can include active devices supporting logic or buffering. In an alternative fabrication sequence, the routing layer can be formed directly on the first die and the second die, such as with an embedded wafer level process, which can optionally include damascene interconnects.

In another exemplary external die-to-die interconnection embodiment, a multi-die structure includes a routing layer, and a first die bonded to a first side of the routing layer and in electrical connection with the routing layer. The first die may include a first FEOL die area including a first communication device, such as transceiver or receiver, and a first BEOL build-up structure spanning over the first FEOL die area. In an embodiment, the first BEOL build-up structure includes a face side with a plurality of chip-level landing pads bonded to the routing layer, and a TSV connecting the first communication device to a back side pad on a back side of the first die opposite the face side. A second die can be further bonded to the back side of the first die and in electrical communication with the back side pad.

The external die-to-die interconnection designs with TSVs in accordance with embodiments can be further combined with various other external and monolithic die-to-die interconnection designs. In an exemplary other external combination, the first BEOL build-up structure can include an inter-chip routing connected to the first communication device. In one implementation, the second die can be hybrid bonded to the first die, and the first die can be hybrid bonded to the routing layer. The first FEOL die area can include a selection device, such as multiplexer or demultiplexer, connected between the first communication device and the inter-chip routing and the TSV. The first FEOL die area can further include a second communication device and a second inter-chip routing connecting the second communication device to a bond pad that is bonded to the first side of the routing layer and in electrical connection with a third die bonded to the first side of the routing layer. In an exemplary other monolithic combination, the first BEOL build-up structure is a chip-level BEOL build-up structure including chip-level die-to-die routing connecting the first die to a third die formed in a same semiconductor substrate as the first die.

BRIEF DESCRIPTION OF THE DRAWINGS

FIGS. 10A-10B are schematic top view illustration of a plurality of dies bonded to a routing layer with pre-existing package-level die-to-die routing for interconnection of die sets in accordance with embodiments.

FIG. 10C is a combination schematic cross-sectional side view illustration and circuit diagram for dies bonded to a routing layer prior to singulation of die sets in accordance with an embodiment.

DETAILED DESCRIPTION

Figure 1A:
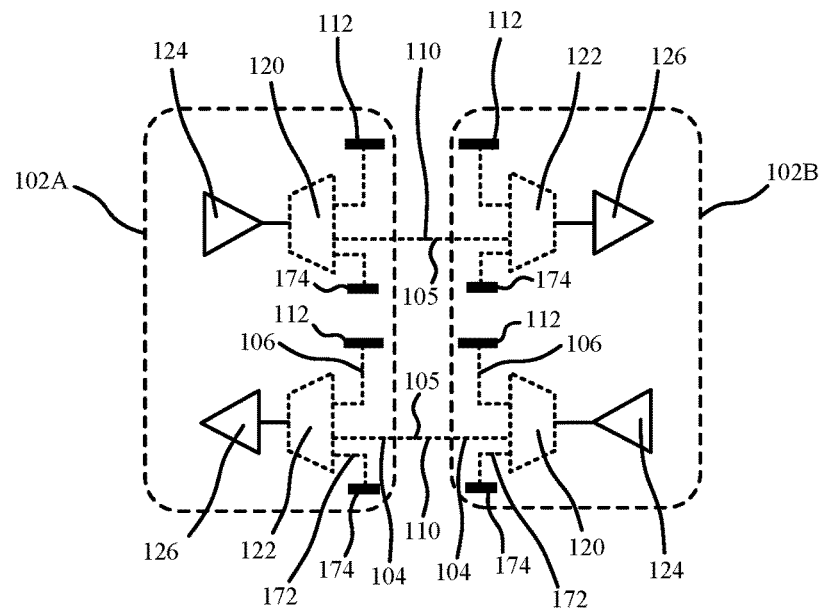
FIG. 1A is a circuit diagram of a redundant die-to-die interconnect layout including chip-level die-to-die routing and bond pads for package-level die-to-die interconnection in accordance with an embodiment.

Embodiments describe multi-die structures and methods of formation including monolithic and external die-to-die interconnection sequences. This may be facilitated by integration of intra-chip routing for chip-level (i.e. monolithic) die-to-die routing between adjacent dies at the wafer level before dicing, as well as inter-chip routing for subsequent package-level (i.e. external) die-to-die routing. For example, a routing layer including external package-level die-to-die routing may be formed during a wafer reconstitution process where separate dies are mounted onto the routing layer (e.g. active or passive interposer) or the routing layer is formed directly on a plurality of dies, which can have been reconstituted using an embedded wafer level packaging sequence.

Selection of the die-to-die interconnection sequence in accordance with embodiments can be pre-determined or made in-situ at the wafer-level during die fabrication. Selection can be based on need such as power, latency, die area, cost, and average manufacturing time. Test pads may additionally be provided during a partially fabricated back-end-of-the-line (BEOL) build-up structure formed over an array of die areas. These test pads can be probed to provide production data. Alternatively, or in addition, tangential process data can be relied upon. Such design and manufacturing methods can also be used to create small or large configurations of interconnected die sets, such as 1x, 2X, 4X, 8X, 16X, etc. For example, smaller die sets such as 1X, 2X, 4X interconnected die sets may be diced with higher yield than larger die sets, such as 6X, 8X, 16X, etc. In some embodiments, smaller die sets with expected higher yield may be fabricated and diced including chip-level (monolithic) die-to-die routing. In some embodiments, larger die sets may be fabricated and diced for subsequence package-level (external) die-to-die routing, for example with a wafer reconstitution sequence of diced dies or diced die sets. For example, external die-to-die interconnection may be selected based on expected lower yield for comparable monolithic die-to-die interconnection of comparable die sets.

In order to facilitate the selection of monolithic or external die-to-die interconnection the dies can include selection devices, such as multiplexers or demultiplexers, to select either intra-chip routing for chip-level die-to-die routing or inter-chip routing for external package-level die-to-die routing. Alternatively, selection can be made lithographically where mask selection can define intra-chip routing and/or inter-chip routing.

An exemplary multi-die structure with monolithic die-to-die interconnection in accordance with embodiments may include a first front-end-of-the line (FEOL) die area of a first die patterned into a semiconductor substrate and a second FEOL die area of a second die patterned into the semiconductor substrate, with the second FEOL die area separate from the first FEOL die area. The multi-die structure may additionally include a first selection device within the first FEOL die area, a second selection device within the second FEOL die area, and a back-end-of-the-line (BEOL) build-up structure spanning over the first FEOL die area and the second FEOL die area. The BEOL build-up structure may additionally include a chip-level die-to-die routing connecting the first selection device with the second selection device, a first inter-chip routing connected to the first selection device, and a second inter-chip routing with the second selection device. Thus, the complementary arrangement of selection devices, such as multiplexer and demultiplexers, in adjacent dies can be used to select the chip-level die-to-die routing or the inter-chip routing for subsequent external die-to-die interconnection. In an embodiment, the inter-chip routings are connected to electrically open terminals, and the selection devices are programmed to select the chip-level die-to-die routing, which can include corresponding inter-chip routings within the BEOL build-up structure.

An exemplary multi-die structure with external die-to-die interconnection in accordance with embodiments may include routing layer (such as interposer, or package-level redistribution layer) that includes a first package-level bond pad, a second package-level bond pad, and a package-level die-to-die routing electrically connecting the first package-level bond pad to the second package-level bond pad. A first die may be bonded to a first side of the routing layer and in electrical connection with the first package-level bond pad, and a second die may be bonded to the first side of the routing layer and in electrical connection with the second package-level bond pad. A variety of bonding methods may be used such as hybrid bonding for a chip-on-wafer (CoW) design, or the routing layer may be formed directly on the first and second dies in an embedded wafer level packaging sequence. Such configurations can eliminate an intermediate conductive bonding layer, such as solder, to create an almost chip-like connection with less power penalty. The first and second dies may be homogenous or heterogenous die types. In an embodiment, at least one of the dies includes a first FEOL die area including a communication device (e.g. transceiver or a receiver), a first BEOL build-up structure spanning over the first FEOL die area, with the first BEOL build-up structure including an electrically open intra-chip routing connected to the communication device, and a chip-level die-to-die routing connecting the communication device to a first bond pad of the first BEOL build-up structure, where the first bond pad is bonded to the routing layer and electrically connected to the first package-level bond pad.

Yet another exemplary multi-die structure with external die-to-die interconnection can be accomplished with through silicon vias (TSVs). Such a configuration may facilitate die-to-die interconnection with 3D die stacking. The various monolithic and external die-to-die interconnection designs can be combined to achieve more complex interconnected structures in accordance with embodiments.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer or feature "over", "spanning" or "on" another layer or bonded "to", in "contact" with or connected "to" another layer may be directly in contact with, or direct connected to, the other layer or feature, or may have one or more intervening layers or features. One layer "between" layers may be directly in contact with the layers or may have one or more intervening layers.

Figure 1B:
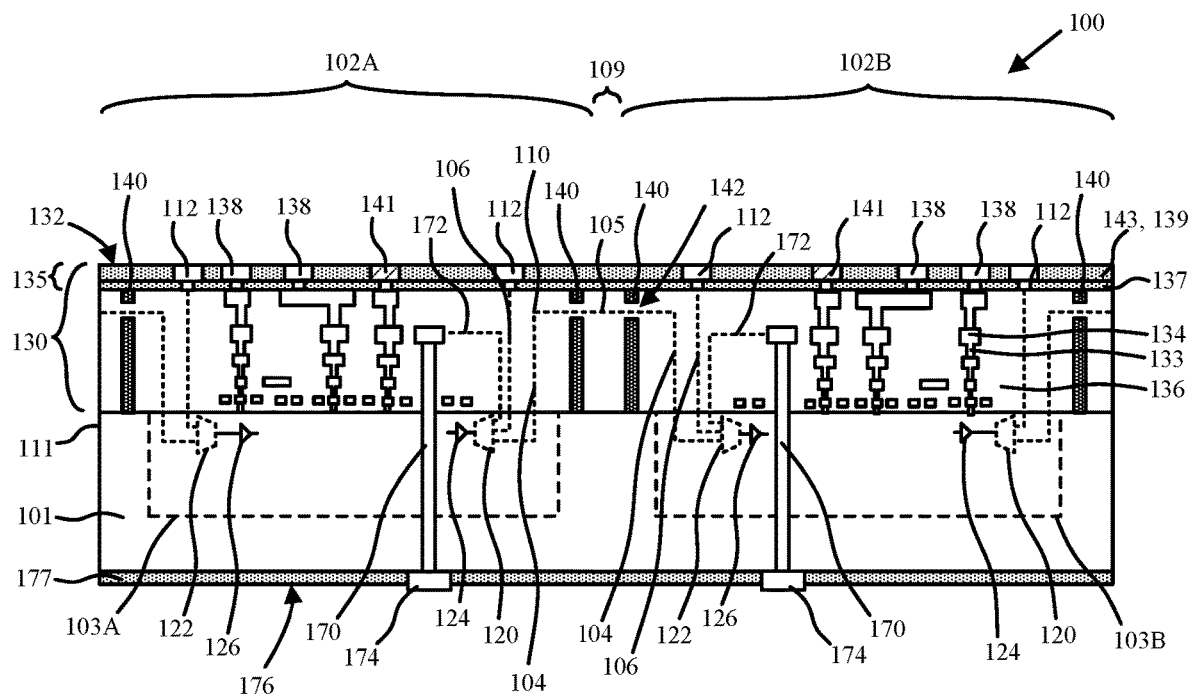
FIG. 1B is a combination schematic cross-sectional side view illustration and circuit diagram for a die set including chip-level die-to-die routing and bond pads for package-level die-to-die interconnection prior to singulation in accordance with an embodiment.

Referring now to FIGS. 1A-1B, FIG. 1A is a circuit diagram of a redundant die-to-die interconnection layout including chip-level die-to-die routing and bond pads for package-level die-to-die interconnection in accordance with an embodiment; FIG. 1B is a combination schematic cross-sectional side view illustration and circuit diagram for a die set including chip-level die-to-die routing and bond pads for package-level die-to-die interconnection prior to singulation in accordance with an embodiment. In particular, FIGS. 1A-1B illustrate a combination of various monolithic and external die-to-die interconnection designs within the same structure. It is to be appreciated that practical applications may implement only some of the interconnection features depending upon flexibility to be integrated into the process flows.

In interest of clarity and conciseness FIGS. 1A-1B are described concurrently. Dies 102A, 102B in accordance with embodiments may have redundant die-to-die routing configurations, including intra-chip routing 104 for chip-level die-to-die routing 110, and well as inter-chip routing 106 to external-facing bond pads 112 for package-level die-to-die interconnection. As shown, in FIG. 1A, the dies 102A, 102B can optionally include one more selection devices such as demultiplexers 120 and/or multiplexers 122 connected to transceivers 124 and receivers 126, respectively. For example, transceivers 124 can be connected to inputs of the demultiplexers, where inter-chip routing 106 connects bond pad 112 to an output of a demultiplexer, and intra-chip routing 104 connects the chip-level die-to-die routing 110 to another output of the demultiplexer 120. It is to be appreciated that the selection devices in accordance with some embodiments, and other methods of forming die-to-die interconnections in accordance with embodiments may leverage lithography for die-to-die routing path selection.

In an embodiment, a multi die structure 100 includes a first front-end-of-the line (FEOL) die area 103A of a first die 102A patterned into a semiconductor substrate 101 and a second FEOL die area 103B of a second die 102B patterned into the semiconductor substrate 101, with the second FEOL die area 103B separate from the first FEOL die area 103A. As shown in FIG. 1B, the multi-die structure may additionally include a first selection device, such as a demultiplexer 120, and transceiver 124 within the first FEOL die area 103A, a second selection device, such as a multiplexer 122, and receiver 126 within the second FEOL die area 103B. A back-end-of-the-line (BEOL) build-up structure 130 can be formed over and spanning over the first FEOL die area 103A and the second FEOL die area 103B. In an embodiment, the BEOL build-up structure 130 additionally includes a chip-level die-to-die routing 110 connecting the first selection device (demultiplexer 120) with the second selection device (multiplexer 122), a first inter-chip routing 104 connected to the first selection device, and a second inter-chip routing 104 with the second selection device. Thus, the complementary arrangement of selection devices, such as demultiplexer 120 and multiplexer 122, in adjacent dies can be used to select the chip-level die-to-die routing 110 or the inter-chip routing 104 for subsequent external die-to-die interconnection.

As shown, each FEOL die area 103A, 103B is formed in the same (semiconductor) substrate 101, such as a silicon wafer. Each FEOL die area 103A, 103B can include the active and passive devices of the dies. A back-end-of-the-line (BEOL) build-up structure 130 provides electrical interconnections and optionally metallic seal structures. The BEOL build-up structure 130 may conventionally fulfill the connectivity requirements of the die(s). The BEOL build-up structure 130 may be fabricated using conventional materials including metallic wiring layers 134 (e.g. copper, aluminum, etc.) and insulating interlayer dielectrics (ILD) 136 such as oxides (e.g. silicon oxide, carbon doped oxides, etc.), nitrides (e.g. silicon nitride), low-k, materials, etc.

The chip-level die-to-die routing 110 may include intra-chip routing 104 from each die connected to stitch routing 105 spanning across a scribe region 109 between the dies. In accordance with embodiments, the intra-chip routing 104 and inter-chip routing 106 may be formed from one or more vias 133 and metal layers 134 within the BEOL build-up structure 130. The inter-chip routing 106 and chip-level die-to-die routing 110 may include multiple routings, formed within multiple metal layers. In accordance with embodiments, the routings can be formed within the lower metal layers M_low, upper metal layers M_high, midlevel metal layers M_mid, and combinations thereof. Generally, the lower metal layers M_low have finer line widths and spacing. Additionally, the interlayer dielectrics (ILDs) for the lower metal and midlevel metal layers may be formed of low_k materials, which can allow quicker moisture transport. Thus, when using the finer wiring layers, additional precautions can be taken in accordance with embodiments, such as passivation of diced chip edges. This may be attributed to making connections between devices. The upper metal layers M_high may have coarser line widths and line spacing, with the midlevel metal layers M_mid having intermediate line widths and spacing. In an embodiment, upper metal layers M_high may be primarily used for stitch routing 105 for lower resistance wiring. In accordance with embodiments, the chip-level die-to-die routing 110 extends through one or more openings 142 in the metallic seals 140 to electrically connect the dies 102.

Referring again to both FIGS. 1A-1B, the chip-level die-to-die routing 110, inter-chip routing 106 and selection devices (demultiplexer 120, multiplexer 122) are illustrated with dotted lines to indicate each is optional. For example, rather than inclusion of selection devices, lithography can be used to determine the formation of chip-level die-to-die routing 110 and/or inter-chip routing 106. Alternatively, selection devices can be used in combination with the formation of both chip-level die-to-die routing 110 and/or inter-chip routing 106. In some embodiments, inter-chip routing 106 can be formed all the way to bond pads 112. In other embodiments, inter-chip routing 106 is partially formed, or not formed at all. Similarly, chip-level die-to-die routing 110 can be formed partially or not at all. Additionally, an optional bypass routing 172 is shown connecting the selection devices to through silicon vias (TSVs) 170 that extend to back side pads 174 on a back side 176 of the multi die structure 100. The back side 176 may correspond to a back side passivation layer 177 on a back side of the semiconductor substrate 101. The optional interconnection of the bypass routing 172, TSVs 170 and back side pads 174 can be formed partially or not at all. Thus, it is to be appreciated that FIGS. 1A-1B illustrated an embodiment with substantial flexibility. In other implementations or embodiments, certain features may be removed for practicality and/or production cost reduction.

Still referring to FIG. 1B, in an embodiment, the BEOL build-up structure 130 includes a face side 132 including a first bond pad 112 and a second bond pad 112, a chip-level die-to-die routing 110 connecting the demultiplexer 120 with the multiplexer 122, a first inter-chip routing 106 connecting the first bond pad 112 with the demultiplexer 120, and a second inter-chip routing 106 connecting the second bond pad 112 with the multiplexer 122. The BEOL build-up structure 130 may additionally include a plurality of chip-level landing pads 138 which may be electrically connected to the first and second FEOL die areas 103A, 103B. The bond pads 112 in accordance are optional and may be utilized for external die-to-die interconnection, such as with hybrid bonding or stitch routing with embedded wafer level processing. Chip-level landing pads 138 can assume different configurations, depending upon the designed die-to-die interconnection. For example, chip-level landing pads 138 may be designed for hybrid bonding with external die-to-die interconnection or designed for solder bump attach for monolithic die-to-die interconnection, such as under burn metallurgy (UBM) pads. Bonding surfaces for hybrid bonding will be planar, while planarity is relaxed for UBM pads to have level top surfaces to receive solder bumps. Additionally, test pads 141 may be located in a variety of locations depending upon interconnection method. In an embodiment, test pads 141 are formed alongside chip-level landing pads 138. For example, the test pads 141 in such a configuration may be UBM pads, where the die set includes monolithic die-to-die interconnection. Alternatively, test pads 141 can be embedded within the BEOL build-up structure 130. In such a configuration, the test pads can be below the bond pads 112 and chip-level landing pads 138 that are designed for hybrid bonding, for example, and external die-to-die interconnection. In an embodiment, buried test pads 141 can be formed of aluminum, as opposed to copper material forming the metallization routing layers within the BEOL build-up structure.

Each die area may represent a complete system, or sub-system. Adjacent die areas may perform the same or different function. In an embodiment, die areas 103A, 103B, for example, interconnected to die-to-die routing can include a digital die area tied to a die area with another function, such as analog, wireless (e.g. radio frequency, RF) or wireless input/output, by way of non-limiting examples. The tied die areas may be formed using the same processing nodes, whether or not having the same or different functions. Whether each die and die area includes a complete system, or are tied subsystems, the die-to-die routing may be for inter-die routing (different systems) or intra-die routing (different, or same subsystems within the same system). For example, intra die-to-die routing may connect different subsystems within a system on chip (SOC) where inter die-to-die routing can connect different SOCs, though this is illustrative, and embodiments are not limited to SOCs. In an embodiment, a die set includes both digital and analog or wireless die areas 103A. 103B. In an embodiment, the different dies 102A, 102B with a die set can include multiple engines, such as a graphics processing unit (GPU), a central processing unit (CPU), a neural engine (e.g. neural network processing engine), an artificial intelligence (AI) engine, a signal processor, networks, caches, and combinations thereof. However, embodiments are not limited to engines, and may include memory devices, such as SRAM, MRAM, DRAM, NVRAM, NAND, cache memory, or other components such as a capacitor, inductor, resistor, power management integrated circuit (IC), amongst others.

In accordance with embodiments, the chip-level die-to-die routing 110 extends through one or more openings 142 in the metallic seals 140 to electrically connect the dies 102. In an embodiment, the openings 142 are lateral openings. For example, the openings 142 may be similar to a gate opening in a fence. In an embodiment, the openings 142 are vertical openings. For example, the openings 142 may be similar to a window in a wall between a floor and ceiling, or open kitchen service counter for illustrative purposes. Openings 142 can assume different shapes, and combinations of lateral and vertical characterizations. Metallic seals 140 can be formed along any and all sides of the dies 102. For example, each die 102 can include a metallic seal 140 along a single side, multiple sides or all sides. A variety of combinations are possible.

Still referring to FIG. 1B, the BEOL build-up structure 130 can include a top passivation layer 135, which can include one or more layers. For example, the top passivation layer 135 can include a sealing layer 137 and optional second sealing layer 143 or bonding layer 139 over the sealing layer 137. The sealing layer(s) 137, 143 may be formed of a nitride, polyimide, etc. to provide chemical and moisture protection to the underlying structure. The optional bonding layer 139 can be provided for die bonding to another routing layer, such as with hybrid bonding. In an embodiment, the bonding layer 139 is formed of a dielectric material such as an oxide (e.g. $SiO_2$) or polymer for dielectric-dielectric (e.g. oxide-oxide, polymer-polymer) bonding in a hybrid bonding operation. Selection of optional second sealing layer 143 or bonding layer 139 in accordance with embodiments may be at least partially determined by whether the structure is manufactured for monolithic and/or external die-to-die interconnection.

In an embodiment, the BEOL build-up structure 130 includes a first metallic seal 140 adjacent the first FEOL die area 103A, and a second metallic seal 140 adjacent the second FEOL die area 103B, wherein the chip-level die-to-die routing 110 extends through a first opening 142 in the first metallic seal 140 and a second opening 142 in the second metallic seal 140. In an embodiment, the chip-level die-to-die routing 110 extends over the first metallic seal 140 and the second metallic seal 140.

In some embodiments, a chip-level die-to-de routing 110 may terminal along a diced die edge 111. In some embodiments, the metallic seal 140 adjacent a diced edge may be continuous, such that a die-to-die routing does not extend through the metallic seal 140 adjacent the diced edge 111. In such a configuration the intra-chip routing of the corresponding chip-level die-to-die routing 110 may be confined laterally inside the metallic seal 140.

Figure 2:
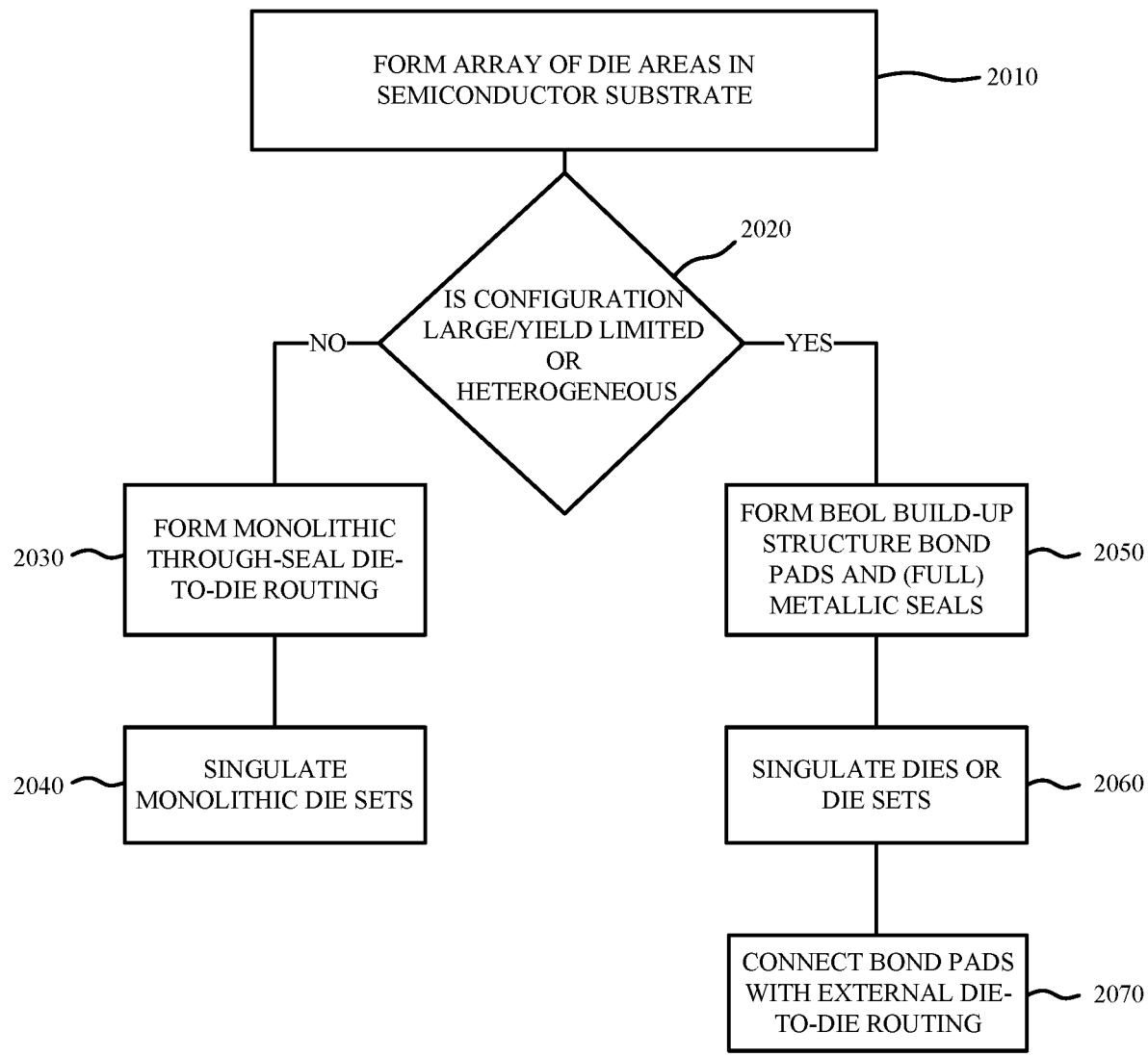
FIG. 2 is a flow chart illustrating a method of fabricating a die set including either monolithic chip-level die-to-die interconnection or external package-level die-to-die interconnection in accordance with an embodiment.

FIG. 2 is a flow chart illustrating a method of fabricating a die set including either monolithic chip-level die-to-die interconnection or external package-level die-to-die interconnection in accordance with an embodiment. At operation 2010 an array of die areas is formed in a semiconductor substrate 101. For example, the die areas may have the same or different functionalities. At operation 2020 a decision is made with regard to individual dies or groups of dies whether the fabrication sequence will proceed for monolithic die-to-die routing process flows (e.g. see FIGS. 4-6) or external die-to-die routing process flows (e.g. see FIGS. 7-14). More specifically, a decision is made whether the die-to-die interconnection configuration will be for large die sets, yield limited die sets, for heterogenous die sets or for physical orientation and configuration (e.g. irregularly shaped area) needs better suiting the system. Where any of these scenarios are a concern, an external die-to-die routing process flow may be followed. Where yields are acceptable (often size of die set limited) and it is possible to form homogenous die sets (from same wafer), then a monolithic die-to-die routing process flow may be followed. The decision may be made prior to BEOL build-up structure 130 fabrication. For example, the decision may be based on yield pre-calculations, where certain die-set, or cluster, sizes will have unacceptable yield. Thus, the external interconnection fabrication route can be pursued for larger configurations using smaller units. For smaller configurations monolithic die-to-die interconnection result in sufficient yield, where bad sections can still be carved out and good portions of the smaller configurations can be recovered. The decision may also be made during BEOL build-up structure 130 fabrication, such as around the time before openings 142 are formed in the metallic seals 140 (see FIG. 1B). The decision may be aided by probing of test pads within the BEOL build-up structure 130, and process metrics. Probing of test pads 141 may also be performed after the decision has been made.

Both monolithic die-to-die interconnection process flows (e.g. FIGS. 4-6) and external die-to-die interconnection process flows (e.g. FIGS. 7-14) in accordance with embodiments may leverage selection devices (e.g. multiplexer, demultiplexer) or lithographically selected wiring schemes.

In a monolithic process flow, through seal chip-level die-to-die routings 110 may be formed, such as through openings 142 within or over metallic seals 140 at operation 2030, followed by singulation of the monolithic die sets at operation 2040. A predetermined monolithic process flow may include the formation of specific die sets with through seal chip-level die-to-die routings 110. In this manner, there is no external interconnection path. Full metallic seals can optionally be formed surrounding the predetermined die sets (e.g. see FIGS. 5B-5C), or optionally through seal chip-level die-to-die routings 110 can be formed between all dies for additional flexibility in carving die sets (e.g. see FIG. 5A). In a more flexible process flow supporting both monolithic and external die-to-die interconnection (e.g. see FIG. 1B), both intra-chip routings 104 and inter-chip routings 106 can be included with termination at UBM pads for flip chip bonding. Specifically, UBM pads include chip-level landing pads 138, test pads 141, and optionally bond pads 112. However, in the exemplary process flows illustrated in FIGS. 4-6, the inter-chip routings 106 (if present) are terminated prior to formation of bond pads 112.

Description of various pads in accordance with embodiments distinguishes pads suitable for flip chip bonding (e.g. UBM pads) and pads suitable for hybrid bonding or formation of a routing layer directly on the dies with embedded wafer level processing. For example, flip chip/UBM pads may have a pitch of 50-100 µm, and be thicker than hybrid bond pads, and optionally be formed of a different material (e.g. aluminum) relative to hybrid bond pads. Additionally, surface finish roughness and particulate requirements are loosened for flip chip compared to hybrid bonding.

In an external process flow, the inter-chip routings 106 are formed all the way up to bond pads 112 at operation 2050. This may be accompanied by the formation of full metallic seals 140 all the way up to the top passivation layer 135. This may be followed by singulation of dies or die sets at operation 2060, which is then followed by connection of the bond pads 112 to external die-to-die routing at operation 2070. In a pre-determined external interconnection process flow through seal chip-level die-to-die routings 110 are not formed. Bond pads 112 may be prepared for hybrid bonding. Specifically, pads conditioned for hybrid bonding, or stitch routing with embedded wafer level processing, can include bond pads 112 and chip-level landing pads 138. Both of which may share a planar face side 132 surface along with bonding layer 139. Furthermore, full metallic seals can be formed around each die 102. In a more flexible process flow supporting both external and monolithic die-to-die interconnection (e.g. see FIG. 1B), both inter-chip routings 106, optionally terminating at bond pads 112 and through seal chip-level die-to-die routings 110 can be included. However, in the exemplary process flows illustrated in FIGS. 7-14, the intra-chip routings 104 are often terminated prior to completion of the chip-level die-to-die routings 110.

As described above, monolithic and external interconnection process flows can have significantly different designs, or substantially similar designs depending upon flexibility to be integrated into the process flow. In the following description various specific process flows are described. It is to be appreciated that the specific configurations illustrated and described are representative of certain implementations of the embodiments, and the embodiments are not necessarily restrictive of one another, as illustrated and described with regard to FIG. 1B.

Figure 3A:
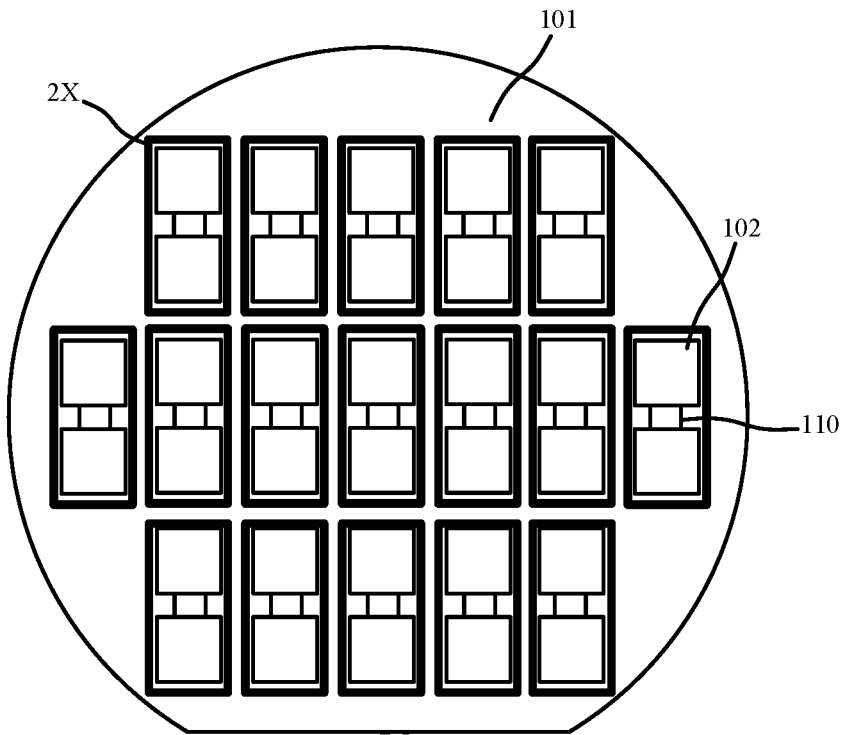
FIG. 3A is a schematic top view illustration of a substrate including an array of die sets including chip-level die-to-die routing prior to singulation in accordance with an embodiment.
Figure 3B:
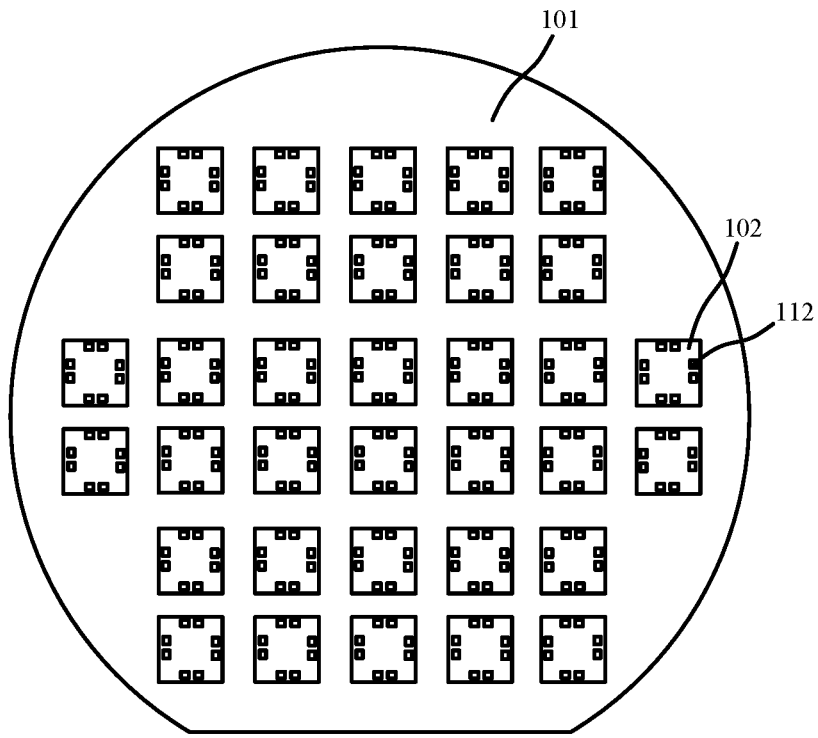
FIG. 3B is a schematic top view illustration of a substrate including an array of dies including bond pads for package level die-to-die interconnection prior to singulation in accordance with an embodiment.

Referring now FIGS. 3A-3B schematic top view illustrations are provided of semiconductor substrates 101 including arrays of dies 102 configured for monolithic or external die-to-die interconnection and prior to singulation in accordance with an embodiment. In the embodiment illustrated in FIG. 3A, an array of 2X die sets is illustrated, each including chip-level die-to-die routing 110 for monolithic die-to-die interconnection. In the embodiment illustrated in FIG. 3B, an array of dies 102 are formed, each including bond pads 112 for external die-to-die interconnection. In accordance with embodiments, chip-level die-to-die-routing 110 and/or bond pads 112 can be formed along a single side, multiple sides, or all sides of the dies 102. Additionally, all dies 102 can potentially be tied together, or specific groups of dies can be configured to be tied together. Thus, a variety of configurations are possible. A potential configuration (e.g. see FIG. 1B) where each die 102 includes chip-level die-to-die routing 110 and bond pads 112 on one or all sides can present a more costly, yet flexible configuration for either carving die sets with chip-level die-to-die routing 110 or dies for external die-to-die interconnection.

Figure 4:
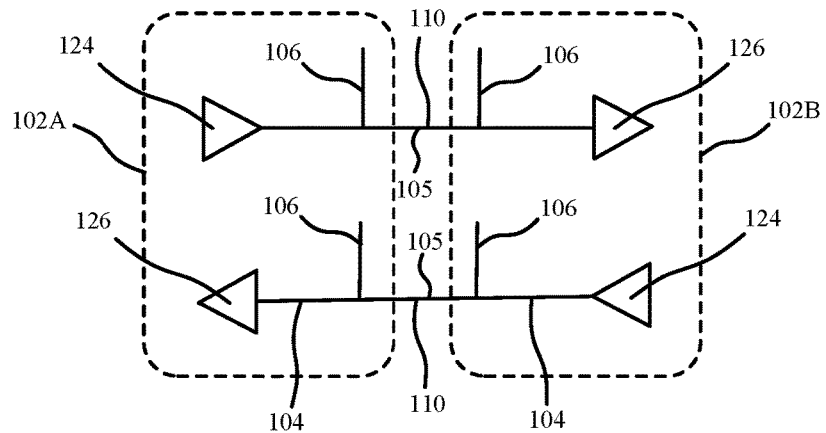
FIG. 4 is a circuit diagram of a die-to-die interconnect layout including chip-level die-to-die routing in accordance with an embodiment.
Figure 5A:
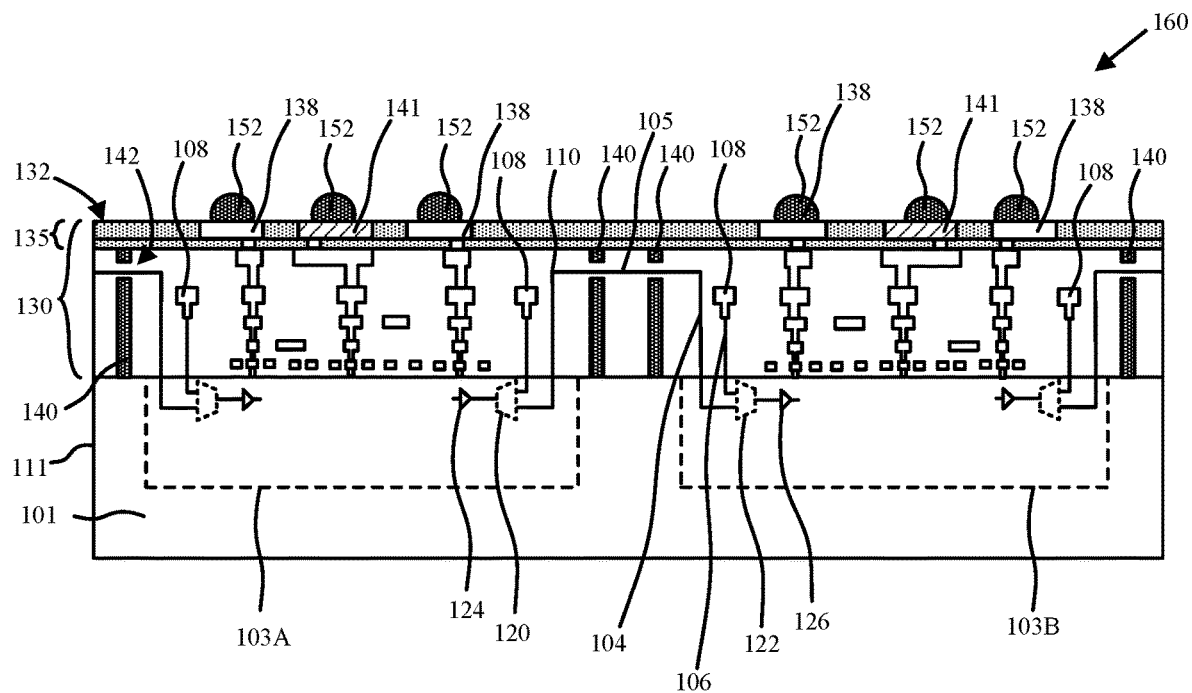
FIGS. 5A-5B are combination schematic cross-sectional side view illustrations and circuit diagrams for a chip including selection devices for chip-level die-to-die routing in accordance with embodiments.
Figure 5B:
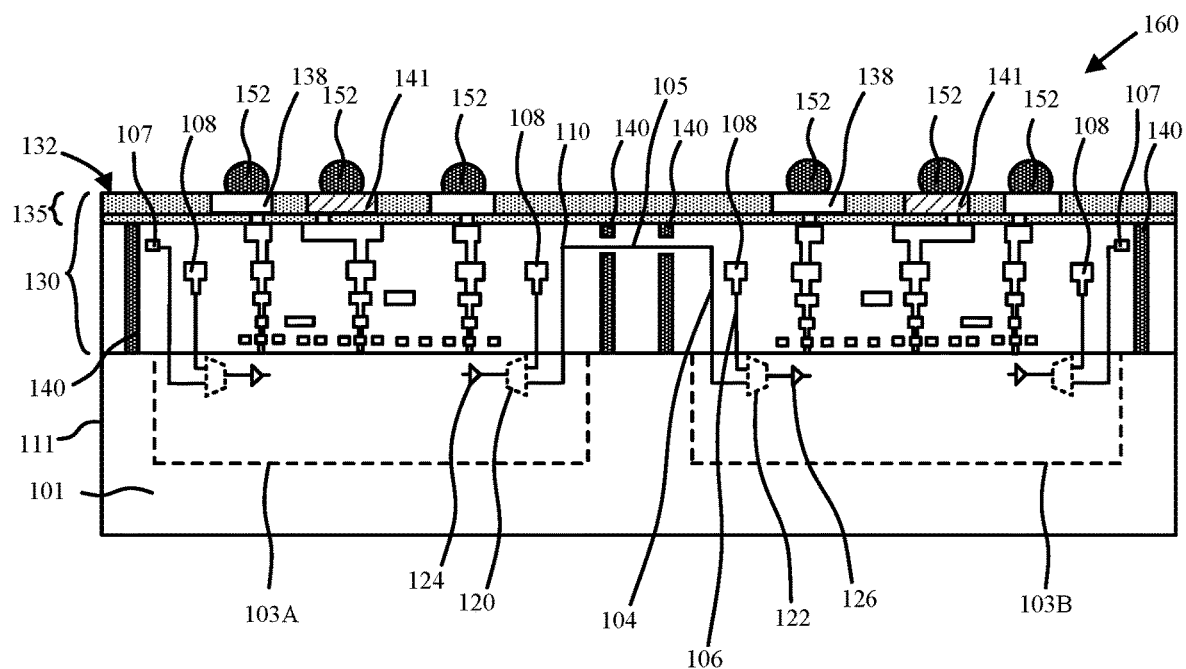
Figure 5C:
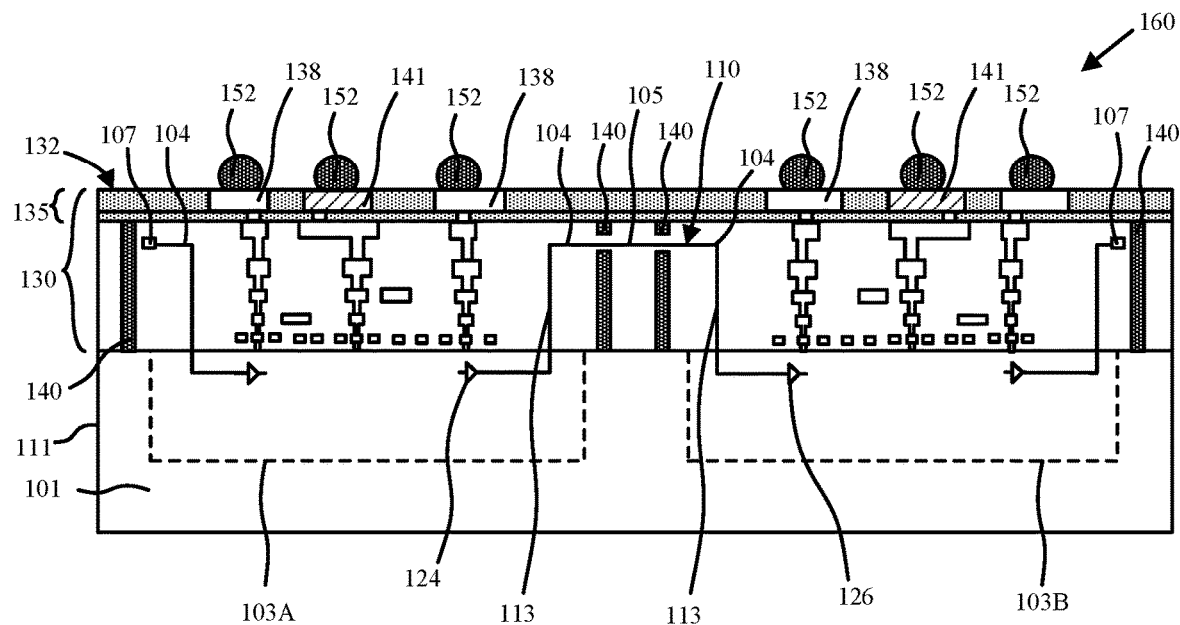
FIG. 5C is a combination schematic cross-sectional side view illustration and circuit diagram for a chip including a lithographically patterned chip-level die-to-die routing in accordance with an embodiment.

Referring now to FIGS. 4-5C, FIG. 4 is a circuit diagram of a die-to-die interconnect layout including chip-level die-to-die routing in accordance with an embodiment; FIGS.

5A-5B are combination schematic cross-sectional side view illustrations and circuit diagrams for a chip 160 including selection devices for chip-level die-to-die routing in accordance with embodiments; FIG. 5C is a combination schematic cross-sectional side view illustration and circuit diagram for a chip 160 including a lithographically patterned chip-level die-to-die routing in accordance with an embodiment. In interest of clarity and conciseness FIGS. 4-5C are described concurrently.

Specifically, FIG. 4 illustrates a circuit diagram similar to that of FIG. 1A, where the demultiplexer 120 and multiplexer 122 are configured to select the chip-level die-to-die routing 110. Thus, the transceiver 124 and receiver 126 communicate through the chip-level die-to-die routing 110. In the embodiment illustrated, the inter-die routing 106 is terminated. For example, the inter-die routing 106 can be terminated at terminals 108 buried within the BEOL build-up structure 130 beneath the face side 132 of the BEOL build-up structure 130. Thus, the inter-die routing 106 can optionally be terminated prior to formation of bond pads 112 of FIG. 1B. In an embodiment, the inter-die routing 106 is terminated after the decision operation 2020 during a partially fabricated BEOL build-up structure 130. However, the decision may have been pre-determined prior to fabrication of the BEOL build-up structure 130, and inter-die routing 106 may be absent. In an alternative embodiment, the inter-die routing 106 can be propagated all the way to bond pads 112 as described with regard to FIG. 1B. The remainder of the BEOL build-up structure 130 can then be formed, followed by probing of test pads 141. This may be followed by placement of solder bumps 152 on at least the chip-level landing pads 138, and optionally test pads 141, and dicing of the die set. It is to be appreciated that while a 2X die set is illustrated in FIG. 5A, that this is exemplary and such as configuration is also applicable for larger and single die sets.

In the particular embodiment illustrated in FIG. 5A, dicing can be performed through a chip-level die-to-die routing 110, which then terminates along a side edge 111 of a die 102. Such processing may be acceptable where the metallic seals 140 with openings 142 provide sufficient sealing function for the devices. Alternatively, the metallic seals 140 along the die (chip) side edges 111 can be full seals, extending from the semiconductor substrate 101 to the top passivation layer 135 as shown in FIG. 5B. In this case the chip-level die-to-die routing 110 at unconnected die side edges 111 ends at terminals 107 inside the full metallic seals 140.

In both embodiments illustrated in FIGS. 5A-5B selection devices, such as demultiplexers 120 and multiplexers 122 are included in order to select the chip-level die-to-die routing 110, as opposed to the inter-die routings 106, which optionally terminate at terminals 108. An equivalent circuit can also be produced lithographically as illustrated in FIG. 5C. As shown in the embodiment illustrated in FIG. 5C, the communication devices (e.g. transceivers 124, receivers 126) are connected directly to the chip-level die-to-die routing 110. In such embodiment, at decision operation 2020, it is determined to pattern the chip-level die-to-die routing 110. In such an embodiment, intra-die routing 104 may include common routing 113 that could have been used for either intra-die routing 104 or inter-die routing 106. Thus, at operation 2020 it is determined to propagate the common routing as part of the chip-level die-to-die routing 110. Thus, there may optionally not be an artifact of inter-die routing 106 present. In an embodiment, at operation 2020 it may optionally be determined to terminate the chip-level die-to-die routing 110 at unconnected die side edges 111 with terminals 107, and to form full metallic seals 140. However, this is optional, and dicing may also be performed through open chip-level die-to-die routing 110 along die edges 111. Alternatively, where die sets are pre-determined, intra-die routing 104 does not exist adjacent the diced side edges 111.

Figure 6:
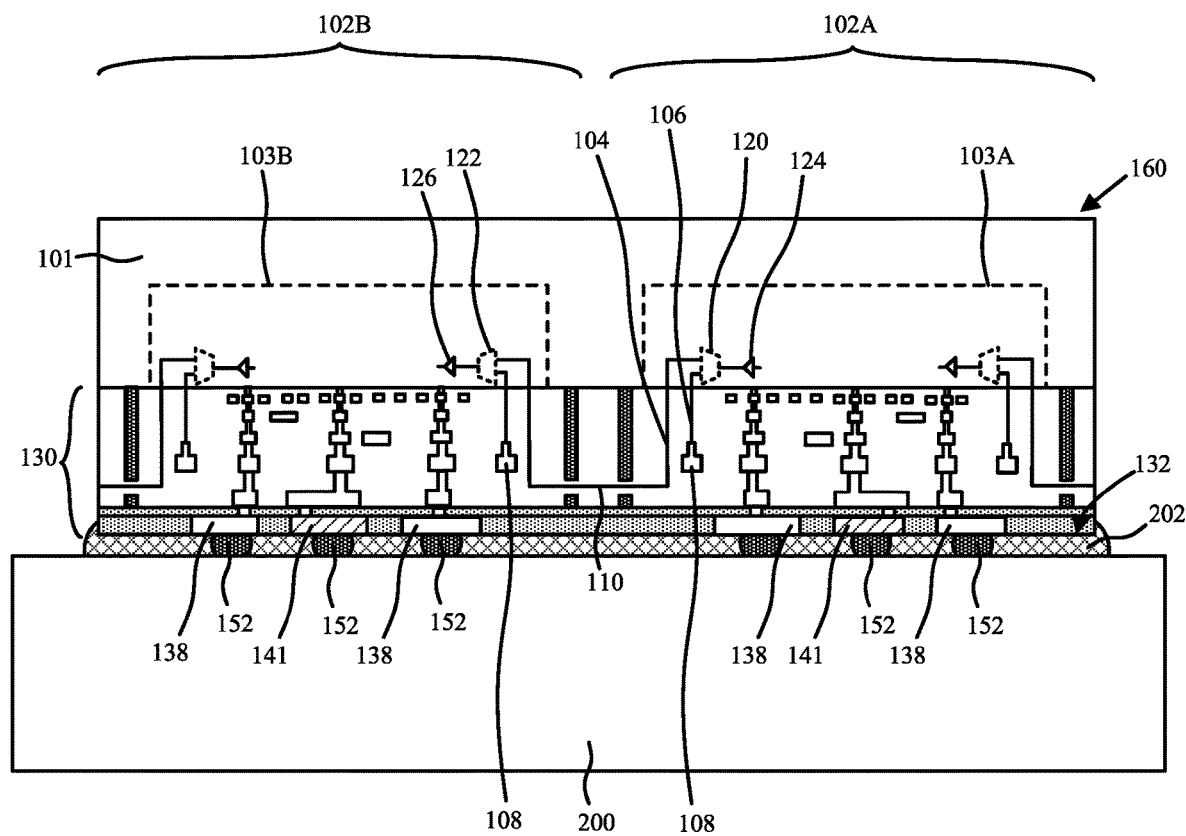
FIG. 6 is a combination schematic cross-sectional side view illustration and circuit diagram for a chip including a chip-level die-to-die routing after bonding to a routing layer in accordance with an embodiment.

FIG. 6 is a combination schematic cross-sectional side view illustration and circuit diagram for a chip 160 including a chip-level die-to-die routing 110 after bonding to a routing layer 200 in accordance with an embodiment. While the chip 160 included in FIG. 6 resembles that of FIG. 5A, FIG. 6 represents a system-level integration where any of the chips 160 of FIGS. 4-5C can be further integrated. For example, the chips 160 can be flip chip bonded with solder bumps 152 onto a routing layer 200 along with other system components. For example, routing layer 200 can be an interposer, package substrate, or system-level printed circuit board. An underfill material 202 may optionally be applied underneath the face side 132 of the chip 160. In an embodiment, the underfill material 202 is an insulator material. The chip 160 may further be encapsulated in a molding compound (not illustrated) on top of the routing layer 200.

Figure 7:
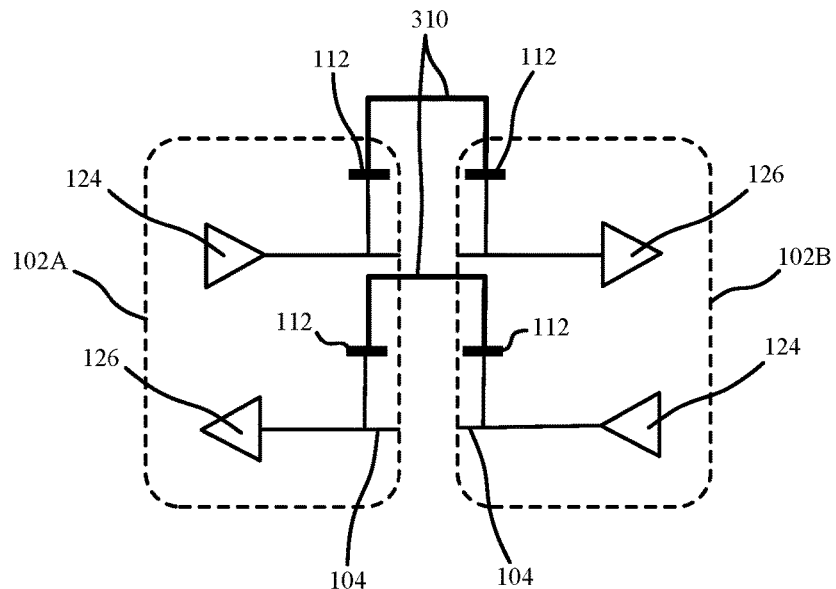
FIG. 7 is a circuit diagram of a die-to-die interconnect layout including package-level die-to-die interconnection in accordance with an embodiment.
Figure 8A:
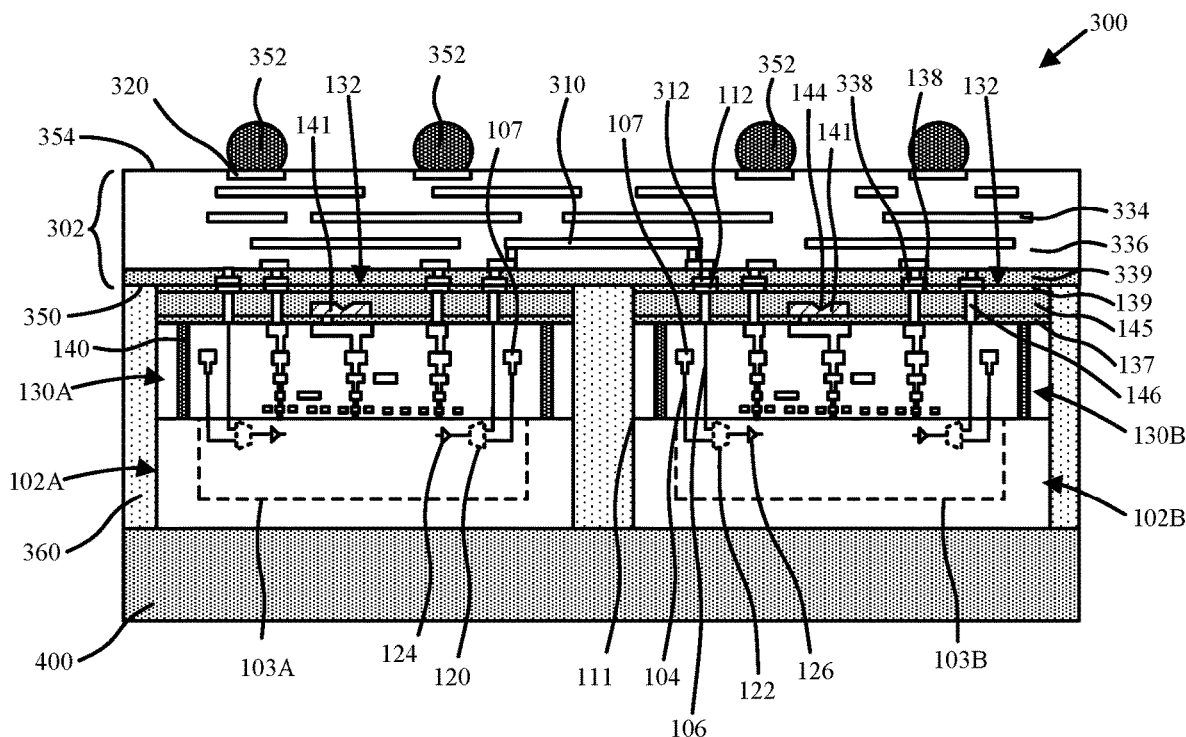
FIG. 8A is a combination schematic cross-sectional side view illustration and circuit diagram for a package including a die set bonded to a routing layer, where the dies include electrically open die-to-die routing and the routing layer includes package-level die-to-die routing for interconnection of the die set in accordance with an embodiment.
Figure 8B:
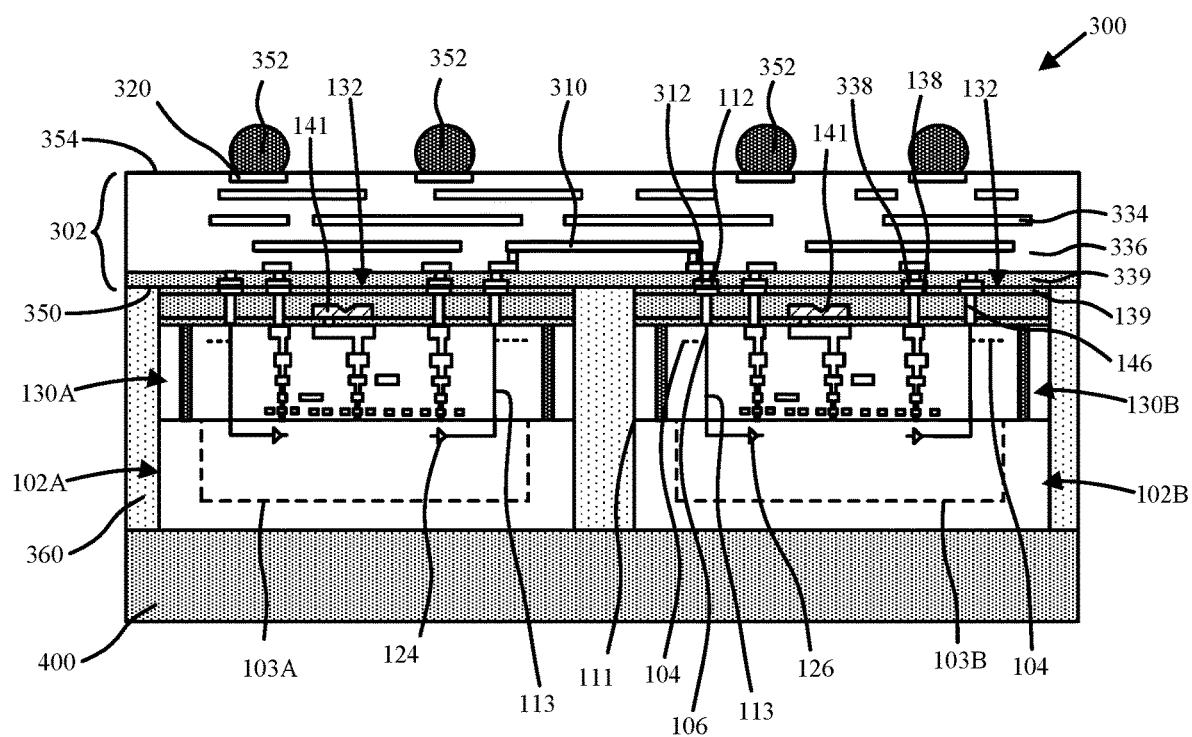
FIG. 8B is a combination schematic cross-sectional side view illustration and circuit diagram for a die set including a lithographically patterned inter-die routing in accordance with an embodiment.

Referring now to FIGS. 7-8B alternative embodiments are illustrated in which external die-to-die interconnection is made with the bond pads 112 rather than the chip-level die-to-die routing 110. FIG. 7 is a circuit diagram of a die-to-die interconnect layout including (external) package-level die-to-die interconnection in accordance with an embodiment; FIG. 8A is a combination schematic cross-sectional side view illustration and circuit diagram for a package 300 including die set bonded to a routing layer 302, where the dies include electrically open die-to-die routing and the routing layer includes package-level die-to-die routing 310 for interconnection of the die set in accordance with an embodiment; FIG. 8B is a combination schematic cross-sectional side view illustration and circuit diagram for a die set including a lithographically patterned inter-die routing 106 in accordance with an embodiment. In interest of clarity and conciseness FIGS. 7-8B are described concurrently.

The configurations of FIGS. 7-8B may result after decision operation 2020, it is determined to pattern the dies 102 for external die-to-die interconnection. For example, where it is determined that monolithic die-to-die interconnection may not meet yield requirements for larger die set, the dies 102 may be designed for external die-to-die interconnection at operation 2020.

In accordance with embodiments, the packages 300 of FIGS. 8A-8B can be formed using reconstitution techniques such as CoW reconstitution, or embedded wafer level processing. In some embodiments, CoW may include hybrid bonding, which can more closely match electrical characteristics of on-chip routing, with mitigated adjustments for performance differences, compared to flip chip solder bonding. Similarly, formation of the routing layer 302 directly on the dies 102, such as a package-level redistribution layer during embedded wafer level processing can similarly be used to match characteristics of on-chip routing. It is to be appreciated that while a 1x die sets are separately bonded to the routing layer illustrated in FIG. 8A, that this is exemplary and such as configuration is also applicable for larger die sets that can include chip-level die-to-die routing 110 therebetween.

Specifically, FIG. 7 illustrates a circuit diagram similar to that of FIG. 1A. In the particular embodiment illustrated in FIG. 7, the demultiplexer 120 and multiplexer 122 are configured to select the bond pads 112 for package-level die-to-die interconnection. Thus, the transceiver 124 and receiver 126 communicate through the bond pads 112 and package-level die-to-die routing 310. The intra-die routings 104 are electrically open, or not formed at all. As shown in FIG. 8A, the intra-die routings 104 may terminate at terminals 107 buried within the BEOL build-up structure 130 beneath the face side 132 of the BEOL build-up structures 130A, 130B. Thus, the intra-die routing 104 can optionally be terminated prior to addition of stitch routing 105. In an alternative embodiment, the intra-die routing 104 can be propagated with stitch routing 105, which can be cut during die singulation. In the embodiment illustrated in FIG. 8B, intra-die routing 104 may optionally be included and also terminate within the BEOL build-up structure 130.

In accordance with embodiments, termination of the intra-die routing 104 within the BEOL build-up structure 130, or not forming intra-die routing 104 at all, can help mitigate the generation of particles that may otherwise be associated with dicing through chip-level die-to-die routing 110. In this manner, particle generation can be reduced, which can facilitate making the face sides 132 prime for CoW bonding, such as with hybrid bonding that can be particularly susceptible to particles. Furthermore, where dicing is not performed through metal layers, plasma dicing techniques may be employed, further reducing debris formation compared to other dicing techniques such as blade sawing or laser dicing.

In a particular embodiment the routing layer 302 and dies 102 can be configured for hybrid bonding. Thus, die face sides 132 include a bonding layer 139 (e.g. oxide or polymer), chip-level landing pads 138, and bond pads 112. Similarly, the routing layer 302 includes a package-level bonding layer 339 (e.g. oxide or polymer), package-level landing pads 338, and optionally package-level bond pads 312. Depending upon determined die set configuration, a first group of the package-level bond pads 312 can be connected to package-level die-to-die routing 310 for interconnection with multiple dies 102. A second group of package-level bond pads 312 may optionally be electrically open and used only to support hybrid bonding. In the illustrated embodiment, the second group of package-level bond pads 312 are not present.

The BEOL build-up structures 130A, 130B illustrated in FIG. 8A differ from those previously described for flip chip bonding. Foremost, test pads 141 can be embedded inside the BEOL build-up structures, beneath the face sides 132, which can be planarized. As shown, a sealing layer 137 can be formed over the metallic seals 140. Test pads 141 can be formed over the sealing layer 137 and connected to the underlying metallization layers with a via. In an embodiment, test pads 141 can be formed of a material (e.g. aluminum) different from the underlying metallization layers (e.g. copper). In some embodiments, test probes can leave indentations 144 on the test pads 141, which may optionally be left electrically open, or further connected. An insulation layer 145 can be formed over the sealing layer 137 to cover the test pads 141, and bonding layer 139 formed over the insulation layer 145. Bond pads 112 and chip-level landing pads 138 can be connected to the underlying metallization layers with vias 146 extending through the sealing layer 137, and optionally insulation layer 145 and bonding layer 139.

Routing layer 302 may be any suitable routing layer, including organic and inorganic interposers, and may be rigid or flexible. Routing layer may be passive or active interposers. In an active interposer, active devices supporting logic and buffering capabilities are feasible. Routing layer can include a plurality of wiring layers 334 and dielectric layers 336. For example, routing layer 302 can be formed by a layer-by-layer thin film processing sequence, such as lamination of the dielectric layers 336, followed by patterning and deposition of the wiring layers 334 and vias 333. Dielectric layers 336 may be formed of suitable materials such as polymer, oxide, etc. The routing layer 302 may optionally include a rigid layer to provide structural integrity.

In an embodiment, a plurality of dies 102 are bonded to a first side 350 of the routing layer 302 including package-level bonding layer 339 (e.g. oxide or polymer), package-level landing pads 338, and optionally package-level bond pads 312. For example, bonding may be hybrid bonding, with metal-metal bonds formed between package-level landing pads 338 and chip-level landing pads 138, and package-level bond pads 312 and die bond pads 112 (when present). Dielectric-dielectric (e.g. oxide-oxide) bonds may be formed between the die bonding layers 139 and package-level bonding layer 339. Alternatively, the routing layer 302 is formed over a reconstituted structure including dies 102 face up and embedded in a gap fill material 360

In an embodiment, routing layer 302 is formed over a reconstituted structure including dies 102 face up and embedded in a gap fill material 360. In an embodiment, the BEOL build-up structures 130A, 130B can include primarily Cu wiring, with an upper metal/wiring layer (e.g. M_high) including test pads being formed of Al. In an embodiment, the routing layer 302 wiring includes equivalent or thicker metal/wiring layers (though finer wiring is possible) than the upper metal/wiring layer (e.g. M_high) of the BEOL build-up structures 130A, 130B, or a wiring layer to which contact is made. The routing layer 302 can be formed using either Cu or Al wiring processes. In an embodiment, the routing layer 302 uses an Al wiring process, which may optionally use (single) damascene vias. Pads or vias used to contact the BEOL build-up structures 130A, 130B though may also be formed of Cu in accordance with embodiments. In some embodiments, the quality of service can be used to organize metal usage based on requirements such as latency, power, etc.

Thus, in either processing sequence each die 102 can be a discrete component with a die-level BEOL build-up structure, and the dies 102 are connected to package-level die-to-die routing 310 in the routing layer 302. The dies 102 may further be encapsulated in a gap fill material 360 on the first side 350 of the routing layer 302. The gap fill material 360 can be formed over and between the separate dies 102. Suitable materials include molding compounds, oxides, and other materials such as silicon pastes, etc. A second side 354 of the routing layer 302 can further include a plurality of landing pads 320. Solder bumps 352 may optionally be placed on the landing pads 320 for further package integration.

As shown in FIGS. 8A-8B, the packages may further include a carrier 400 on back sides of the dies 102. For example, the carrier 400 may provide structural support and/or function as a thermal sink. Carrier 400 may be present where dies 102 are thinned in some configurations.

Figure 9A:
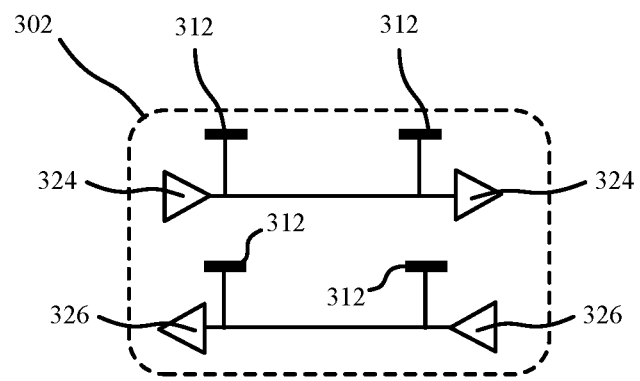
FIG. 9A is a circuit diagram of an active routing layer in accordance with an embodiment.
Figure 9B:
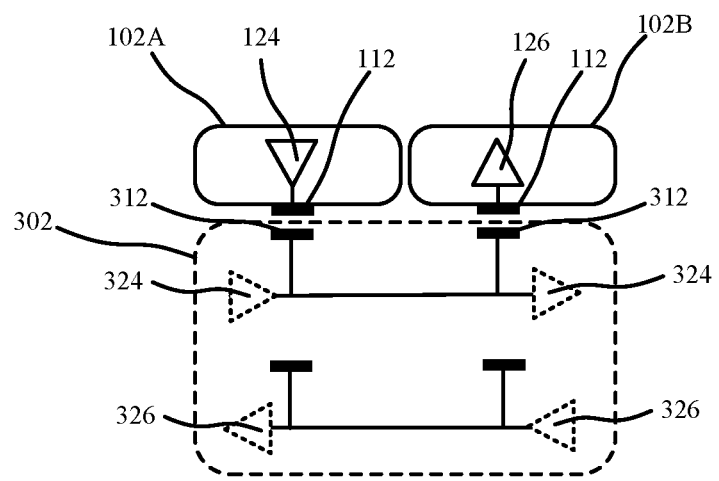
FIG. 9B is a circuit diagram of a die set bonded to an active routing layer in accordance with an embodiment.
Figure 11:
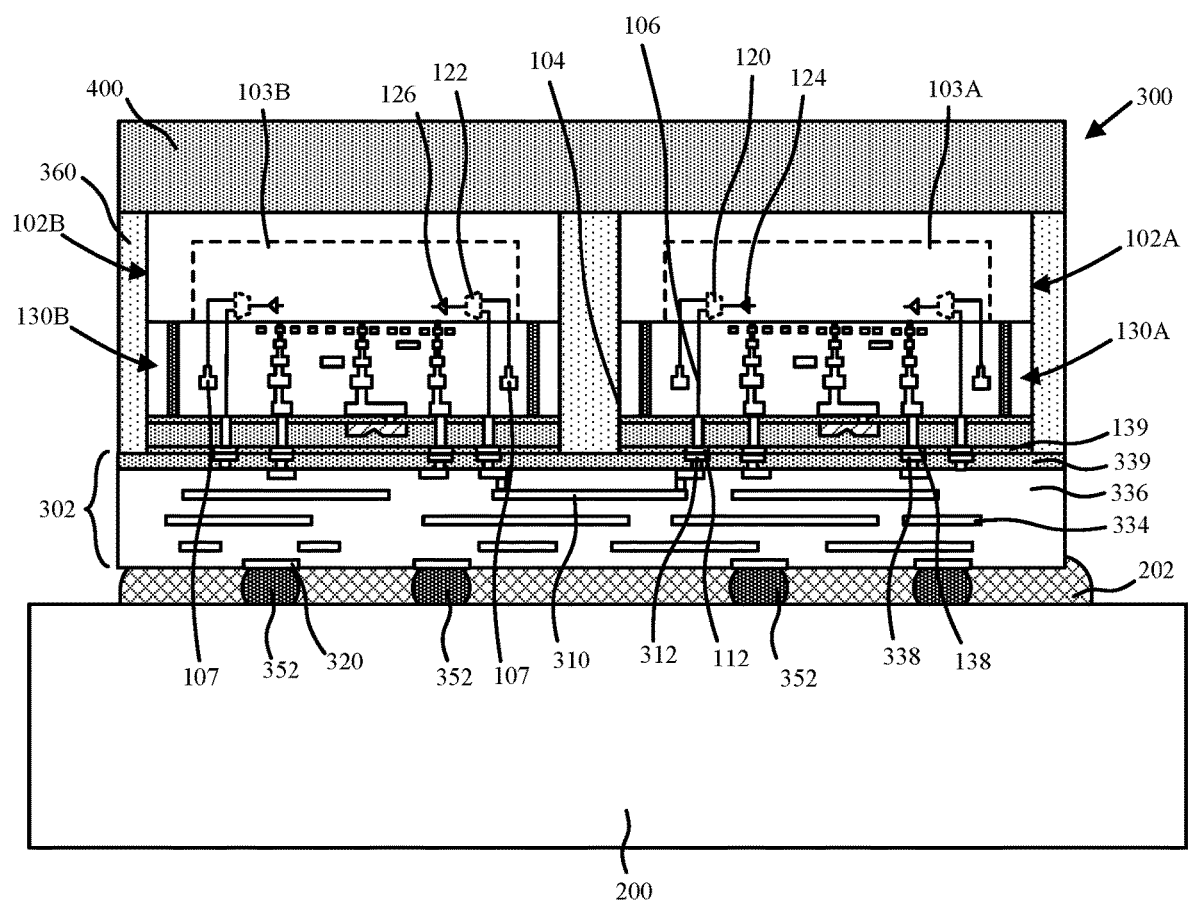
FIG. 11 is a combination schematic cross-sectional side view illustration and circuit diagram for a package bonded to a system routing layer, the package including dies with electrically open die-to-die routing bonded to a routing layer with package-level die-to-die routing for interconnection of the die set in accordance with an embodiment.

Referring now to FIGS. 9A-9B, FIG. 9A is a circuit diagram of an active routing layer 302 (e.g. interposer) in accordance with an embodiment; FIG. 9B is a circuit diagram of a die set bonded to an active routing layer 302 in accordance with an embodiment. As shown, the routing layer 302 can include transceivers 324 and receivers 326, along with package-level bond pads 312, which can be tested for addition of the dies 102A, 102B. For example, dies 102A, 102B can be hybrid bonded to the active routing layer 302 using bond pads 112 as previously described. An active routing layer 302 in accordance with embodiments may allow for function testing such as a power delivery network opens/shorts, capacitor opens/shorts and interconnect tests. The active routing layer 302 may additionally include buffers in the routing layers connecting transceivers 324 and receivers 326. Upon testing of the active routing layer 302, known good dies can then be bonded to known good sites of the active routing layer 302. Transceiver 324 and receiver 326 can be tristated in functional mode as shown with dashed lines in FIG. 9B (i.e. after die mounting), and only activated in a testing mode for the routing layer 302 (e.g. FIG. 9A) to determine a known-good routing layer prior to die mounting. Transceiver 124 and receiver 126 from dies' 102A, 102B functional logic are used to communicate. The active routing layer 302 may provide additional buffering, routing, and logic functions.

The packages 300 in accordance with embodiments can be singulated from a wafer-level or panel-level reconstitution sequence. FIGS. 10A-10B are schematic top view illustration of a plurality of dies 102 bonded to a routing layer 302 with pre-existing package-level die-to-die routing 310 for interconnection of die sets in accordance with embodiments. While not required, the routing layer 302 can be routed to carve out specific die sets, such as 4X, 6X, 8X etc. depending upon production requirements. The pre-existing or later formed package-level die-to-die routing 310 is made possible by placement of known good dies 102. As shown in FIGS. 10A-10B, the dies 102 can be the same type (homogenous integration) or different (heterogenous integration), and may have different sizes, shapes, and technology nodes for the formation of devices.

FIG. 10C is a combination schematic cross-sectional side view illustration and circuit diagram for dies 102 bonded to a routing layer 302 prior to singulation of die sets in accordance with an embodiment. As shown, the dies 102 can be bonded followed by encapsulation with a gap fill material 360. Alternatively, the dies can be mounted onto the carrier 400 face up, followed by deposition of gap fill material, and formation of the routing layer 302. Solder bumps 352 can optionally be placed onto landing pads 320, followed by singulation of packages 300 including specified die sets. Packages 300 may then be further integrated. For example, in the embodiment illustrated in FIG. 11, a package 300 can be bonded to a routing layer 200 such as another package substrate or system-level printed circuit board along with other system components and optionally underfilled with an underfill material 202.

Figure 12:
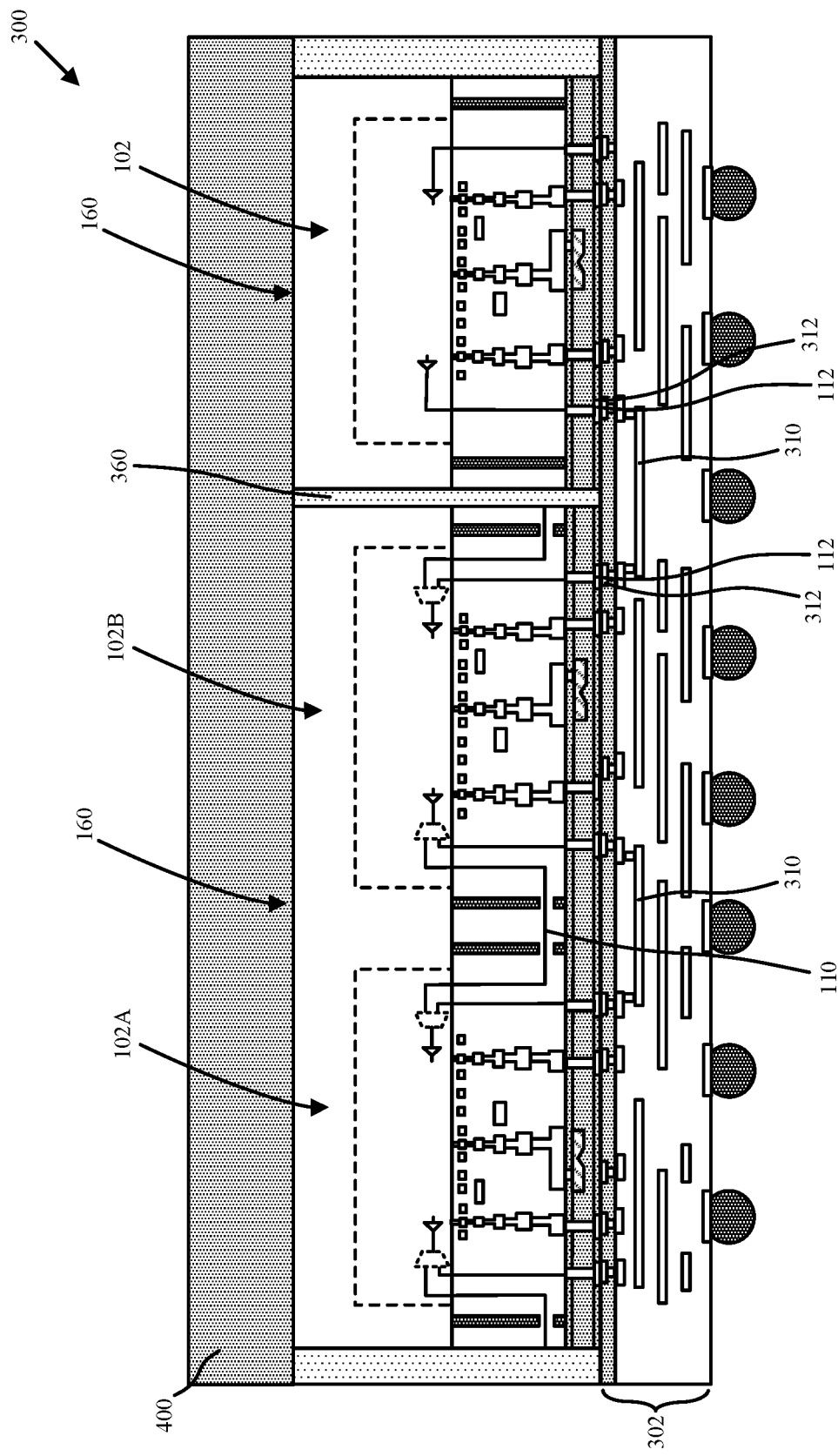
FIG. 12 is a combination schematic cross-sectional side view illustration and circuit diagram for a package including a chip including monolithic die-to-die routing along with a second chip where the first chip and second chip are connected to external package-level die-to-die routing in accordance with an embodiment.

Referring now to FIG. 12, a package 300 is illustrated as including a chip including monolithic chip-level die-to-die routing 110 along with a second chip where the first chip and second chip are connected to external package-level die-to-die routing 310. The embodiment illustrated in FIG. 12 illustrates how various embodiments can be combined, including the flexibility of the monolithic multi-die structure of FIGS. 1B and 4-6 with an additional die 102/chip 160 using external die-to-die interconnection of FIGS. 7-11. It is to be appreciated a variety of combinations of the described embodiments are possible to combine both monolithically connected die sets and externally connected die sets. Additionally, the routing layer 302 can be active or passive.

Up until this point, external die-to-die interconnection has been described as being made with bond pads 112, and suitable techniques such as chip-on-wafer bonding or stitching with embedded wafer level processing. It is to be appreciated that external die-to-die interconnection can also be made with TSV die-to-die interconnection, as shown in FIGS. 1A-1B. TSVs 170 can also be combined with the other monolithic or external die-to-die interconnection schemes, whether the TSVs 170 are ultimately connected or not. For example, the TSVs 170 may correspond to unconnected artifacts, or active die-to-die connections. Furthermore, TSVs 170 can be pre-selected without formation of inter-chip routing 106 or intra-chip routing 104, or with electrically open inter-chip routing 106 and/or intra-chip routing 104 artifacts.

Figure 13:
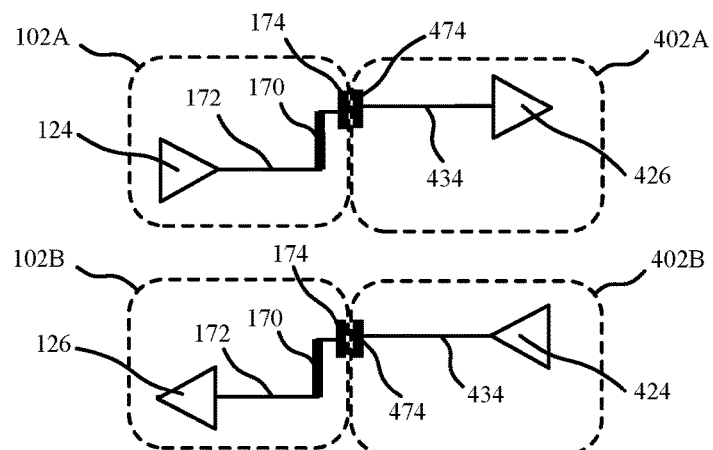
FIG. 13 is a circuit diagram of TSV die-to-die interconnection layouts in accordance with an embodiment.
Figure 14:
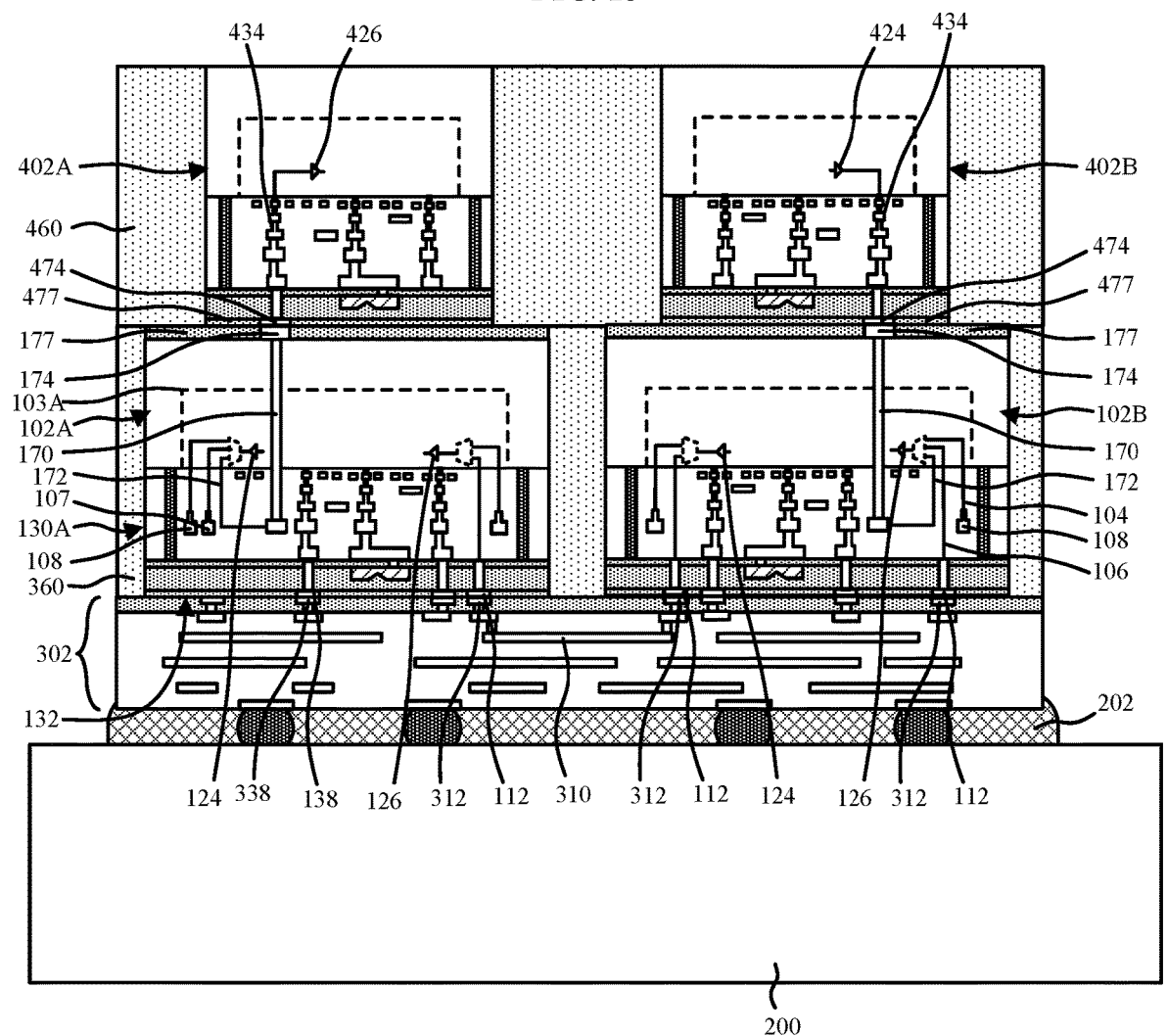
FIGS. 14-15 are combination schematic cross-sectional side view illustrations and circuit diagrams for 3D die stacks including TSV die-to-die interconnection in accordance with embodiments.
Figure 15:
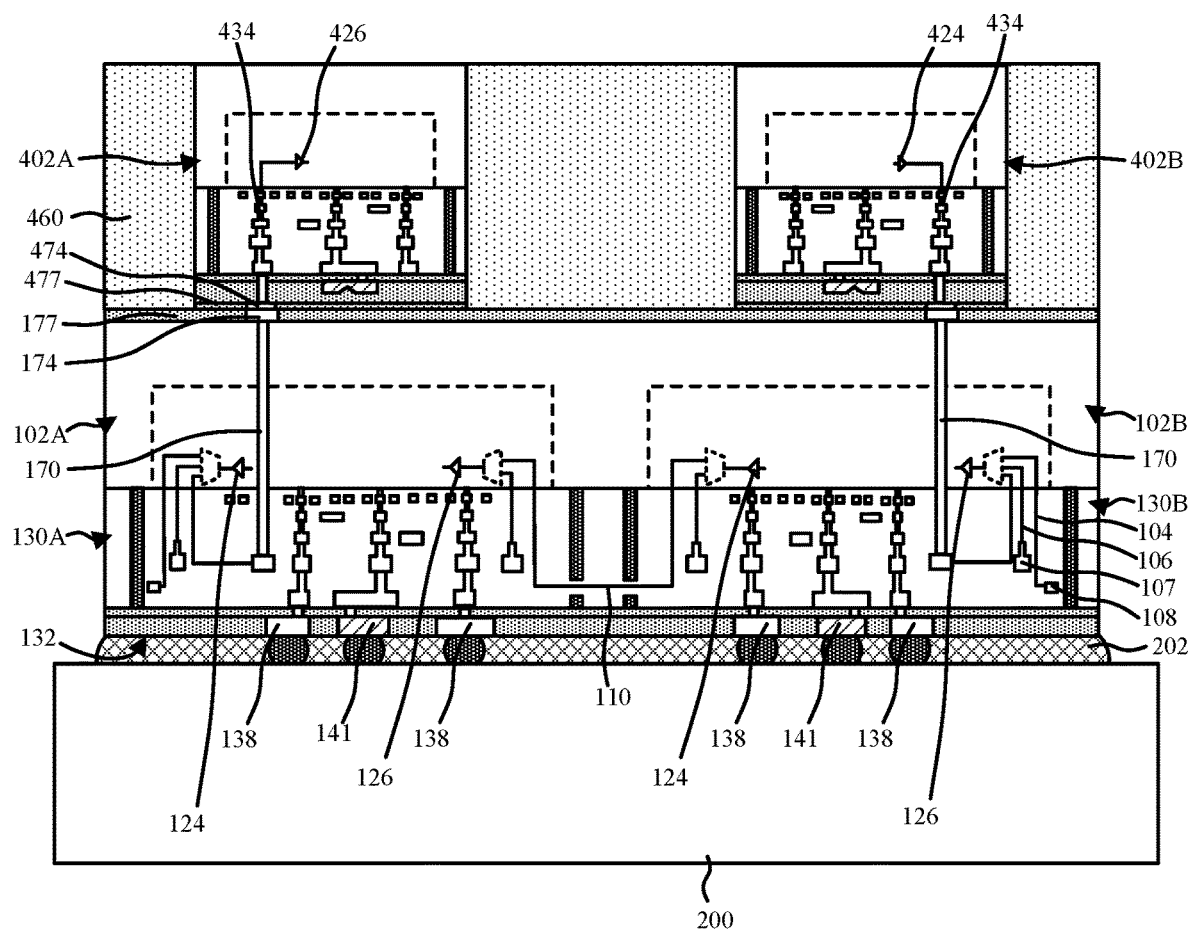

Referring now to FIGS. 13-15, FIG. 13 is a circuit diagram of TSV die-to-die interconnection layouts in accordance with an embodiment; FIGS. 14-15 are combination schematic cross-sectional side view illustrations and circuit diagrams for 3D die stacks including TSV die-to-die interconnection in accordance with embodiments. Specifically, the embodiment illustrated in FIG. 14 includes additional die stacked on top of an existing external die-to-die interconnection arrangement such as that illustrated and described with regard to FIGS. 7-12, while the embodiment illustrated in FIG. 15 includes additional die stacked on top of an existing monolithic die-to-die interconnection arrangement such as that illustrated and described with regard to FIGS. 4-6. It is to be appreciated, these are exemplary implementations, and embodiments including TSV die-to-die interconnection are not so limited. In interest of clarity and conciseness FIGS. 13-15 are described together.

In the particular embodiments illustrated, one or more dies can be connected through TSV 170 routing. Similar to previous embodiments, the dies 102A, 102B can each include one or more selection devices (transceivers 124 and receivers 126), as well as bypass routing 172 connecting the selection devices to the TSVs 170, which are connected to back side pads 174. As shown, one or more additional dies 402A, 402B can be bonded to the back sides of the dies 102A, 102B. For example, one or more dies can be bonded to the back side of a single die 102A, 102B. Alternatively, a die (e.g. 402A) can be bonded to back sides, and span, multiple dies 102A, 102B. The additional dies 402A, 402B may further be encapsulated in a gap fill material 460 after mounting onto the underlying die(s) 102A, 102B. Gap fill material 460 may also be formed of similar materials as gap fill material 360 and may be formed directly on gap fill material 360.

In the particular embodiment illustrated, each additional die 402A, 402B includes at least one bond pad 474 that can be bonded with the back side pads 174 of the underlying dies 102A, 102B. For example, this may be a metal-metal bond as with hybrid bonding. Thus, the additional dies 402A, 402B can include a dielectric bonding layer 477 (e.g. oxide or polymer) that bonds with the back side passivation layer 177 (also oxide or polymer). Each additional die 402A, 402B may additionally include routing 434 connected to a corresponding selection device (e.g. transceiver 424 or receiver 426) that is complementary with the selection device of the underlying die 102A, 102B to which it is electrically connected. While the additional dies 402A, 402B are illustrated as including a single selection device, it is to be appreciated this is intended to not overly complicate the drawings and that each of the additional dies 402A, 402B may include multiple selection devices, including transceivers and receivers to satisfy functionality. Furthermore, dies 102A, 102B may be connected to the additional dies 402A, 402B with multiple complementary selection devices.

In an embodiment, a multi-die structure includes a routing layer 302, a first die 402A bonded to a first side of the routing layer 302 (FIG. 14), 200 (FIG. 15) and in electrical connection with the routing layer 302, 200. For example, this may be accomplished with chip-level landing pads 138/package-level landing pads 338 and bond pads 112/package-level bond pads 312 as shown in the embodiment illustrated in FIG. 14. In the embodiment illustrated in FIG. 15, the die set including dies 102A, 102B can be flip chip mounted onto the routing layer 200. In either embodiment, the first die 102A includes a first FEOL die area 103A including a first communication device (e.g. transceiver 124 or receiver 126), and a first BEOL build-up structure 130A spanning over the first FEOL die area 103A. The first BEOL build-up structure 130A may include a face side including a plurality of chip-level landing pads 138 bonded to the routing layer 302, 200.

The first BEOL build-up structure 130A may additionally include an inter-chip routing 106 connected to the first communication device, as well as a TSV 170 connecting the first communication device to a back side pad 174 on a back side of the first die 102A opposite the face side. Intra-chip routing 104 may also be connected to the first communication device along with the bypass routing 172 connecting the TSV 170 with the communication device. In the illustrated embodiment, a second die 402A is bonded to the back side of the first die 102A and in electrical communication with the back side pad 174. For example, the second die 402A can be hybrid bonded to the first die 102A.

In an embodiment, the first FEOL die area 103A further includes a selection (e.g. multiplexer or demultiplexer) connected between the first communication device and the inter-chip routing 106 and the TSV 170.

The first die 102A may additionally be connected to additional dies as described in previous embodiments. As shown in FIG. 14, the first FEOL die area 103A may additionally include a second communication device and a second inter-chip routing 106 connecting the second communication device to a bond pad 112 that is bonded to the first side of the routing layer 302, and in electrical connection with third die 102B that is also bonded to the first side of the routing layer 302. The first die 102A and the third die 102B can be electrically connected to package-level die-to-die routing 310 as previously described. As shown in FIG. 15, the first BEOL build-up structure is a chip-level BEOL build-up structure 130 including chip-level die-to-die routing 110 connecting the first die 102A (and first communication device, receiver 126) to a third die 102B (and corresponding communication device, transceiver 124) formed in a same semiconductor substrate 101 as the first die 102A. As shown, embodiments facilitate the formation, and combination of, a variety of die-to-die interconnection schemes, and combinations of monolithic and/or external die-to-die interconnections.

In utilizing the various aspects of the embodiments, it would become apparent to one skilled in the art that combinations or variations of the above embodiments are possible for forming die sets with dies configured for monolithic and external die-to-die interconnection. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A multi-die structure comprising:
   a first front-end-of-the line (FEOL) die area of a first die patterned into a semiconductor substrate and a second FEOL die area of a second die patterned into the semiconductor substrate, the second FEOL die area separate from the first FEOL die area;
   a first selection device within the first FEOL die area;
   a second selection device within the second FEOL die area; and
   a back-end-of-the-line (BEOL) build-up structure spanning over the first FEOL die area and the second FEOL die area, the BEOL build-up structure comprising:
      a chip-level die-to-die routing connecting the first selection device with the second selection device;
      a first inter-chip routing connected to the first selection device; and
      a second inter-chip routing with the second selection device.

2. The multi-die structure of claim 1, wherein the first inter-chip routing is electrically connected to an electrically open first terminal, and the second inter-chip routing is electrically connected to an electrically open second terminal.

3. The multi-die structure of claim 2, wherein the first terminal and the second terminal are both buried within the BEOL build-up structure beneath a face side of the BEOL build-up structure.

4. The multi-die structure of claim 1, wherein the BEOL build-up structure includes additional routing connecting the first FEOL die and the second FEOL die area to a plurality of chip-level landing pads.

5. The multi-die structure of claim 4, further comprising a corresponding plurality of solder bumps on the plurality of chip-level landing pads.

6. The multi-die structure of claim 1, wherein the BEOL build-up structure includes a first metallic seal adjacent the first FEOL die area, and a second metallic seal adjacent the second FEOL die area, wherein the chip-level die-to-die routing extends through a first opening in the first metallic seal and a second opening in the second metallic seal.

7. The multi-die structure of claim 1, wherein the BEOL build-up structure includes a first metallic seal adjacent the first FEOL die area, and a second metallic seal adjacent the second FEOL die area, wherein the chip-level die-to-die routing extends over the first metallic seal and the second metallic seal.

8. The multi-die structure of claim 7, wherein:
   the first FEOL die area includes a third selection device, and the first BEOL build-up structure includes an open chip-level die-to-die routing connected to the third selection device; and
   the open chip-level die-to-die routing extends through a second opening in the first metallic seal.

9. The multi-die structure of claim 8, wherein the open chip-level die-to-die routing terminates at a side edge of the first die.

10. The multi-die structure of claim 1, wherein the first FEOL die area includes a transceiver connected to an input of the first selection device, and the second FEOL die area includes a receiver connected to an output of the second selection device.

11. The multi-die structure of claim 1, further comprising a through silicon via connected to the first selection device.

* * * * *